United States Patent
Jang et al.

(10) Patent No.: US 11,451,244 B2
(45) Date of Patent: Sep. 20, 2022

(54) DEVICE AND METHOD FOR ENCODING AND DECODING USING POLAR CODE IN WIRELESS COMMUNICATION SYSTEM

(71) Applicants: Samsung Electronics Co., Ltd., Suwon-si (KR); RESEARCH & BUSINESS FOUNDATION SUNGKYUNKWAN UNIVERSITY, Suwon-si (KR)

(72) Inventors: Min Jang, Suwon-si (KR); Sanghyo Kim, Suwon-si (KR); Hyunjae Lee, Suwon-si (KR); Hyosang Ju, Suwon-si (KR); Jonghwan Kim, Suwon-si (KR); Hongsil Jeong, Suwon-si (KR)

(73) Assignees: Samsung Electronics Co., Ltd., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 17/277,041

(22) PCT Filed: Jul. 23, 2019

(86) PCT No.: PCT/KR2019/009096
§ 371 (c)(1),
(2) Date: Mar. 17, 2021

(87) PCT Pub. No.: WO2020/067637
PCT Pub. Date: Apr. 2, 2020

(65) Prior Publication Data
US 2021/0281279 A1    Sep. 9, 2021

(30) Foreign Application Priority Data

Sep. 28, 2018 (KR) .......................... 10-2018-0115862

(51) Int. Cl.
*H03M 13/11* (2006.01)
*H03M 13/13* (2006.01)
(Continued)

(52) U.S. Cl.
CPC ....... *H03M 13/1148* (2013.01); *H03M 13/09* (2013.01); *H03M 13/13* (2013.01); *H03M 13/6502* (2013.01)

(58) Field of Classification Search
CPC .. H03M 13/1148; H03M 13/09; H03M 13/13; H03M 13/458
(Continued)

(56) References Cited

U.S. PATENT DOCUMENTS 8,522,124 B2 * 8/2013 Kim .................... G06F 11/1048
714/801
2010/0103001 A1 * 4/2010 Shokrollahi ...... H03M 13/3761
341/94
(Continued)

FOREIGN PATENT DOCUMENTS

KR    10-2018-0105125 A    9/2018

OTHER PUBLICATIONS

Cao et al., Irregular polar coding for massive MIMO channels, IEEE, pp. 1 to 7. (Year: 2017).*
(Continued)

*Primary Examiner* — Shelly A Chase
(74) *Attorney, Agent, or Firm* — Jefferson IP Law, LLP

(57) ABSTRACT

The present disclosure relates to a 5th generation (5G) or pre-5G communication system for supporting a higher data transfer rate beyond a 4th generation (4G) communication system such as long term evolution (LTE). The present disclosure relates to encoding and decoding using a polar code in a wireless communication system. A method for operation of a first device in a wireless communication
(Continued)

system may comprise the steps of: among sub-blocks including at least one node, identifying at least one inactive sub-block to deactivate the node operation in the sub-blocks; encoding data by using a construction matrix determined on the basis of the at least one inactive sub-block; and transmitting the encoded data to a second device.

14 Claims, 36 Drawing Sheets

(51) Int. Cl.
*H03M 13/09* (2006.01)
*H03M 13/00* (2006.01)

(58) Field of Classification Search
USPC .................................. 714/758, 756, 759, 764
See application file for complete search history.

(56) References Cited

U.S. PATENT DOCUMENTS

| | | | |
|---|---|---|---|
| 2013/0149970 A1* | 6/2013 | Durick | H04W 24/02 455/67.11 |
| 2015/0349909 A1 | 12/2015 | El-Khamy et al. | |
| 2016/0302083 A1* | 10/2016 | Durick | H04W 24/02 |
| 2017/0033892 A1* | 2/2017 | Luby | H03M 13/458 |
| 2017/0222317 A1* | 8/2017 | Durick | H04W 24/02 |
| 2018/0226999 A1 | 8/2018 | Wang et al. | |
| 2018/0241504 A1 | 8/2018 | Raza et al. | |
| 2018/0351579 A1 | 12/2018 | Hong et al. | |
| 2020/0305213 A1* | 9/2020 | Teyeb | H04W 76/15 |

OTHER PUBLICATIONS

Ju et al., "On Inactivation of Polarization Units for Reducing Polar Coding Computational Complexity", Jun. 2018.
Huawei, HiSilicon, "3GPP TSG RAN WG1 Meeting #86 R1-167209", Gothenburg, Sweden, Aug. 22-26, 2016.
Toshiaki Koike-Akino et al., "Irregular Polar Coding for Multi-Level Modulation in Complexity-Constrained Lightwave Systems", 2017 European Conference on Optical Communication (ECOC), IEEE, Sep. 17, 2017, pp. 1-3, XP033336172.
Extended European Search Report dated Oct. 1, 2021, issued in European Patent Application No. 19866763.6.

\* cited by examiner

FIG. 13A

Bit sequence 1300: $u_0, u_1, u_2, u_3, u_4, u_5, u_6, \ldots, u_{58}, u_{59}, u_{60}, u_{61}, u_{62}, u_{63}$ (1302 highlights $u_0$–$u_3$)

Table 1310:

| 1312 | 1314 Number of information bits | 1316 Number of frozen bits |
|---|---|---|
| $b_0$ | 0 | 4 |
| $b_1$ | 0 | 4 |
| $b_2$ | 0 | 4 |
| $b_3$ | 1 | 3 |
| $b_4$ | 0 | 4 |
| $b_5$ | 1 | 3 |
| $b_6$ | 2 | 2 |
| $b_7$ | 4 | 0 |
| $b_8$ | 0 | 4 |
| $b_9$ | 2 | 2 |
| $b_{10}$ | 3 | 1 |
| $b_{11}$ | 4 | 0 |
| $b_{12}$ | 3 | 1 |
| $b_{13}$ | 4 | 0 |
| $b_{14}$ | 4 | 0 |
| $b_{15}$ | 4 | 0 |

Table 1320 (N=16 code seq.):

| 1312 | 1314 Number of information bits | 1316 Number of frozen bits |
|---|---|---|
| $b_0$ | 0 | 4 |
| $b_1$ | 0 | 4 |
| $b_2$ | 0 | 4 |
| $b_4$ | 0 | 4 |
| $b_8$ | 0 | 4 |
| $b_3$ | 1 | 3 |
| $b_5$ | 1 | 3 |
| $b_6$ | 2 | 2 |
| $b_9$ | 2 | 2 |
| $b_{10}$ | 3 | 1 |
| $b_{12}$ | 3 | 1 |
| $b_7$ | 4 | 0 |
| $b_{11}$ | 4 | 0 |
| $b_{13}$ | 4 | 0 |
| $b_{14}$ | 4 | 0 |
| $b_{15}$ | 4 | 0 |

Groupings: 1322, 1324, 1326

| Index (1330) | Sub-block index (1332) | State (1334) | Degree (1336) | Sub-block degree (1338) | State of sub-block inactivation (1340) |
|---|---|---|---|---|---|
| 0 | 0 | F | 1 | 3 | o |
| 1 | | F | 2 | | |
| 2 | 1 | F | 2 | 6 | o |
| 3 | | F | 4 | | |
| 4 | 2 | F | 2 | 6 | o |
| 5 | | F | 4 | | |
| 6 | 3 | F | 4 | 12 | x |
| 7 | | I | 8 | | |
| 8 | 4 | F | 2 | 6 | x |
| 9 | | I | 4 | | |
| 10 | 5 | I | 4 | 12 | o |
| 11 | | I | 8 | | |
| 12 | 6 | I | 4 | 12 | o |
| 13 | | I | 8 | | |
| 14 | 7 | I | 8 | 24 | o |
| 15 | | I | 16 | | |

FIG.13B

| Index (1602) | Sub-block index (1604) | State (1606) | Degree (1608) | Sub-block degree (1610) | State of sub-block inactivation (1612) |
|---|---|---|---|---|---|
| 0 | 0 | F | 1 | 3 | o |
| 1 | | F | 2 | | |
| 2 | 1 | F | 2 | 6 | x |
| 3 | | CRC | 4 | | |
| 4 | 2 | F | 2 | 6 | x |
| 5 | | CRC | 4 | | |
| 6 | 3 | CRC | 4 | 12 | x |
| 7 | | I | 8 | | |
| 8 | 4 | F | 2 | 6 | x |
| 9 | | I | 4 | | |
| 10 | 5 | I | 4 | 12 | x |
| 11 | | I | 8 | | |
| 12 | 6 | I | 4 | 12 | o |
| 13 | | I | 8 | | |
| 14 | 7 | I | 8 | 24 | o |
| 15 | | I | 16 | | |

| Index (1802) | Sub-block index (1804) | State (1806) | Degree (1808) | Sub-block degree (1810) | State of sub-block inactivation (1812) |
|---|---|---|---|---|---|
| 0 | 0 | Punc | 1 | 3 | o |
| 1 | | Punc | 2 | | |
| 2 | 1 | Punc | 2 | 6 | o |
| 3 | | F | 4 | | |
| 4 | 2 | F | 2 | 6 | o |
| 5 | | F | 4 | | |
| 6 | 3 | F | 4 | 12 | x |
| 7 | | I | 8 | | |
| 8 | 4 | F | 2 | 6 | x |
| 9 | | CRC | 4 | | |
| 10 | 5 | CRC | 4 | 12 | x |
| 11 | | I | 8 | | |
| 12 | 6 | I | 4 | 12 | o |
| 13 | | I | 8 | | |
| 14 | 7 | I | 8 | 24 | o |
| 15 | | I | 16 | | |

FIG.18A

| Index (1822) | Sub-block index (1824) | State (1826) | Degree (1828) | Sub-block degree (1830) | State of sub-block inactivation (1832) |
|---|---|---|---|---|---|
| 0 | 0 | F | 1 | 3 | o |
| 1 | | F | 2 | | |
| 2 | 1 | F | 2 | 6 | x |
| 3 | | CRC | 4 | | |
| 4 | 2 | F | 2 | 6 | x |
| 5 | | CRC | 4 | | |
| 6 | 3 | I | 4 | 12 | x |
| 7 | | I | 8 | | |
| 8 | 4 | F | 2 | 6 | x |
| 9 | | I | 4 | | |
| 10 | 5 | I | 4 | 12 | x |
| 11 | | I | 8 | | |
| 12 | 6 | I | 4 | 12 | x |
| 13 | | Punc | 8 | | |
| 14 | 7 | Punc | 8 | 24 | o |
| 15 | | Punc | 16 | | |

FIG.18B

DEVICE AND METHOD FOR ENCODING AND DECODING USING POLAR CODE IN WIRELESS COMMUNICATION SYSTEM

CROSS-REFERENCE TO RELATED APPLICATION(S)

This application is a U.S. National Stage application under 35 U.S.C. § 371 of an International application number PCT/KR2019/009096, filed on Jul. 23, 2019, which is based on and claimed priority of a Korean patent application number 10-2018-0115862, filed on Sep. 28, 2018, in the Korean Intellectual Property Office, the disclosure of which is incorporated by reference herein in its entirety.

TECHNICAL FIELD

The disclosure relates generally to a wireless communication system, and more particularly, to an apparatus and a method for encoding and decoding by using a polar code in a wireless communication system.

BACKGROUND ART

Efforts to develop enhanced $5^{th}$ generation (5G) communication systems or pre-5G communication systems have been ongoing in order to meet the increasing demand for wireless data traffic since $4^{th}$ generation (4G) communication systems were commercialized. For this reason, the 5G communication systems or pre-5G communication systems are called Beyond 4G network communication systems or post long term evolution (LTE) systems.

The 5G communication system is considered to be implemented in a superhigh frequency (mmWave) band (for example, 60 GHz band) to achieve a high data transmission rate. For the 5G communication systems, technologies for beamforming, massive multiple input multiple output (MIMO), full dimensional MIMO (FD-MIMO), array antenna, analog beam-forming, and large scale antenna are being discussed to mitigate a path loss of a radio wave and to increase a transmission distance of a radio wave in the superhigh frequency band.

In addition, technologies for evolved small cells, enhanced small cells, cloud ratio access network (RAN), ultra-dense network, device to device communication (D2D), wireless backhaul, moving network, cooperative communication, coordinated multi-points (CoMP), and interference cancellation in the 5G communication systems are developing to enhance networks of systems.

In addition, hybrid frequency shift keying and quadrature amplitude modulation (FQAM) and sliding window superposition coding (SWSC), which are advanced coding modulation (ACM) methods, and filter bank multi carrier (FBMC), non-orthogonal multiple access (NOMA), and sparse code multiple access (SCMA) which are enhanced accessing technology in the 5G systems are developing.

Use of the polar code in the 5G system has been discussed. The polar code suggested by Arikan is the first error-correction code that provably achieves channel capacity. After the polar code was suggested, successive cancellation (SC) decoding, SC-list (SCL) decoding for enhancing performance of a finite length to the maximum, cyclic redundancy check (CRC)-aided SCL (CA-SCL) decoding, etc. have been suggested in sequence. However, in the case of such a decoding algorithm as CA-SCL, there is a disadvantage that an area, a space, and operation complexity of a hardware implementation memory excessively increase. Accordingly, algorithms having low operation complexity without degradation of performance are developing.

DISCLOSURE OF INVENTION

Technical Problem

Based on the above-described discussions, the disclosure provides an apparatus and a method for encoding and decoding by using a polar code in a wireless communication system.

In addition, the disclosure provides an apparatus and a method for encoding and decoding through inactivation of a sub-block in a wireless communication system.

In addition, the disclosure provides an apparatus and a method for determining a generator matrix of a polar code according to a sub-block index in a wireless communication system.

In addition, the disclosure provides an apparatus and a method for determining an inactivation sub-block based on a decoding method of a reception end in a wireless communication system.

In addition, the disclosure provides an apparatus and a method for determining an inactivation sub-block when successive cancellation (SC) decoding is performed in a wireless communication system.

In addition, the disclosure provides an apparatus and a method for determining an inactivation sub-block when successive cancellation list (SCL) decoding is performed in a wireless communication system.

In addition, the disclosure provides an apparatus and a method for determining an inactivation sub-block when cyclic redundancy check (CRC)-aided SCL (CA-SCL) decoding is performed in a wireless communication system.

In addition, the disclosure provides an apparatus and a method for determining an inactivation sub-block when CA-SCL decoding to which a puncturing technique is applied is performed in a wireless communication system.

Solution to Problem

According to various embodiments of the disclosure, an operating method of a first device in a wireless communication system may include: from among sub-blocks comprising at least one node, identifying at least one inactivation sub-block for inactivating a node operation in the sub-blocks; encoding data by using a generator matrix which is determined based on the at least one inactivation sub-block; and transmitting the encoded data to a second device.

According to various embodiments of the disclosure, an operating method of a second device in a wireless communication system may include: receiving encoded data from a first device; from among sub-blocks comprising at least one node, identifying at least one inactivation sub-block for inactivating a node operation within the sub-blocks; and decoding the encoded data, based on the at least one inactivation sub-block, and the encoded data may be encoded by using a generator matrix which is determined based on the at least one inactivation sub-block.

According to various embodiments of the disclosure, a first device in a wireless communication system may include: at least one processor configured to, from among sub-blocks comprising at least one node, identify at least one inactivation sub-block for inactivating a node operation in the sub-blocks, and to encode data by using a generator matrix which is determined based on the at least one inactivation sub-block; and a transmission and reception unit configured to transmit the encoded data to a second device.

According to various embodiments of the disclosure, a second device in a wireless communication system may include: a transmission and reception unit configured to receive encoded data from a first device; and at least one processor configured to, from among sub-blocks comprising at least one node, identify at least one inactivation sub-block for inactivating a node operation within the sub-blocks, and to decode the encoded data, based on the at least one inactivation sub-block, and the encoded data may be encoded by using a generator matrix which is determined based on the at least one inactivation sub-block.

Advantageous Effects of Invention

The apparatus and method according to various embodiments of the disclosure provide low operation complexity without degrading performance, in comparison to related-art polar code encoding and decoding methods.

In addition, the apparatus and method according to various embodiments of the disclosure can simplify a generator matrix of a polar code, and accordingly, can simplify an encoding and decoding process.

The effect achieved in the disclosure is not limited to those mentioned above, and other effects that are not mentioned above may be clearly understood to those skilled in the art based on the description provided below.

BRIEF DESCRIPTION OF DRAWINGS

FIG. 13A is a view illustrating an example of determining an inactivation sub-block when SC decoding is performed in a wireless communication system according to various embodiments of the disclosure;

FIG. 13B is a view illustrating an example of determining an inactivation sub-block when SC decoding is performed in a wireless communication system according to various embodiments of the disclosure;

FIG. 16A is a view illustrating an example of determining an inactivation sub-block when CA-SCL decoding is performed in a wireless communication system according to various embodiments of the disclosure;

FIG. 18A is a view illustrating an example of determining an inactivation sub-block when an unknown bit is punctured in a wireless communication system according to various embodiments of the disclosure;

FIG. 18B is a view illustrating an example of determining an inactivation sub-block when a known bit is punctured in a wireless communication system according to various embodiments of the disclosure;

BEST MODE FOR CARRYING OUT THE INVENTION

Terms used in the disclosure are used to describe specified embodiments and are not intended to limit the scope of other embodiments. The terms of a singular form may include plural forms unless otherwise specified. All of the terms used herein, which include technical or scientific terms, may have the same meaning that is generally understood by a person skilled in the art. It will be further understood that terms, which are defined in a dictionary, may be interpreted as having the same or similar meanings as or to contextual meanings of the relevant related art and not in an idealized or overly formal way, unless expressly so defined herein in the disclosure. In some cases, even if the terms are terms which are defined in the specification, they should not be interpreted as excluding embodiments of the present disclosure.

In various embodiments of the disclosure described below, hardware-wise approach methods will be described by way of an example. However, various embodiments of the disclosure include technology using both hardware and software, and thus do not exclude software-based approach methods.

The disclosure relates to an apparatus and a method for effectively encoding and decoding by using a polar code in a wireless communication system. Specifically, the disclosure describes technology for encoding and decoding through inactivation of a sub-block in a wireless communication system.

As used herein, terms indicating signals, terms indicating channels, terms indicating control information, terms indicating network entities, terms indicating components of a device, terms indicating a structure of an encoding/decoding algorithm or a design parameter are merely examples for convenience of explanation. Accordingly, the disclosure is not limited to the terms described below, and other terms having the same technical meanings may be used.

In addition, the disclosure describes various embodiments by using terms used in some communication standards (for example, $3^{rd}$ generation partnership project (3GPP)), but these embodiments are merely examples. Various embodiments of the disclosure may be easily modified and applied to other communication systems.

Figure 1:
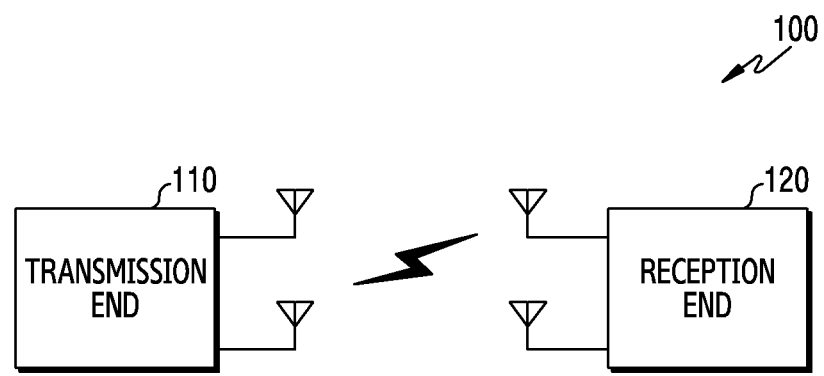
FIG. 1 is a view illustrating a wireless communication system according to various embodiments of the disclosure.

FIG. 1 illustrates a wireless communication system according to various embodiments of the disclosure. FIG. 1 illustrates a transmission end 110 and a reception end 120 as some of nodes using a wireless channel in a wireless communication system. Although FIG. 1 illustrates one transmission end 110 and one reception end 120, a plurality of transmission ends or a plurality of reception ends may be included. In addition, although it is illustrated in the disclosure that the transmission end 110 and the reception end 120 are separate entities for convenience of explanation, functions of the transmission end 110 and the reception end 120 may be reversed. For example, in the case of an uplink of a cellular communication system, the transmission end 110 may be a terminal and the reception end 120 may be a base station. In the case of a downlink, the transmission end 110 may be a base station and the reception end 120 may be a terminal. The base station may be referred to as "access point (AP)," "eNodeB (eNB)," "5G node," "next generation nodeB (gNB)", "wireless point," "transmission/reception point (TRP)," or other terms having the same technical meaning as the above-mentioned terms, in addition to the "base station." The terminal may be referred to as "user equipment (UE)," "mobile station," "subscriber station," "remote terminal," "wireless terminal," "user device," or other terms having the same technical meaning as the above-mentioned terms, in addition to the "terminal."

In some embodiments, the transmission end 110 may identify an inactivation sub-block, may encode data based on the identified sub-block, and may transmit the encoded data to the reception end 120. In some embodiments, the reception end 120 may receive the encoded data from the transmission end, may identify the inactivation sub-block, and may decode the data based on the identified sub-block.

Figure 2:
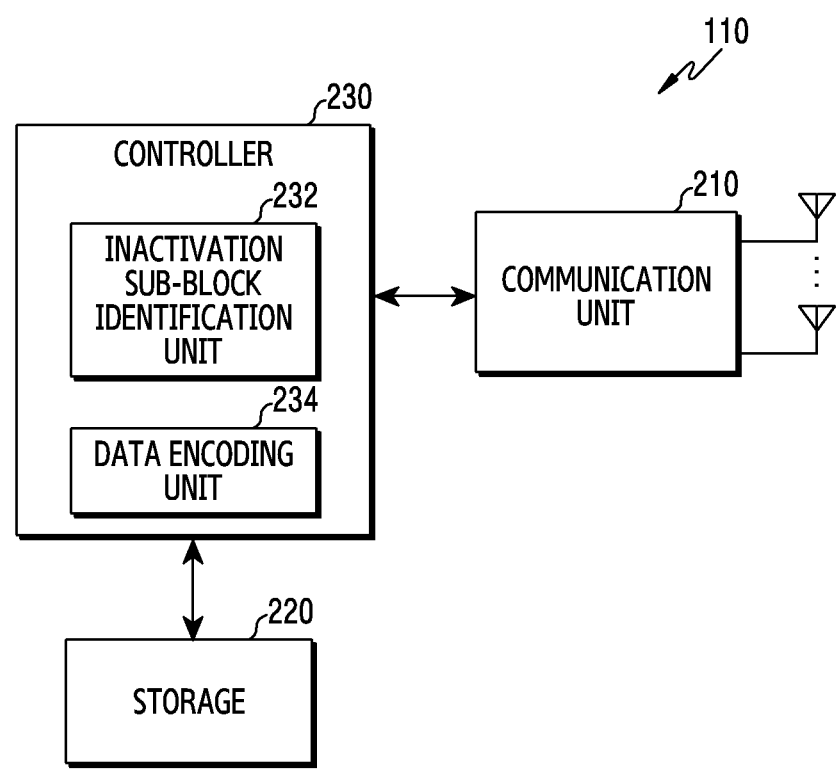
FIG. 2 is a view illustrating an example of a configuration of a transmission end device in a wireless communication system according to various embodiments of the disclosure.

FIG. 2 illustrates an example of a configuration of a transmission end device in a wireless communication system according to various embodiments of the disclosure. That is, the configuration illustrated in FIG. 2 may be understood as a configuration of the transmission end 110. The term "unit" or terms ending with suffixes "-er," and "-or" refer to a unit processing at least one function or operation, and may be implemented by hardware, software, or a combination of hardware and software.

Referring to FIG. 2, the transmission end 110 may include a communication unit 210, a storage 220, and a controller 230, and the controller 230 may include an inactivation sub-block identification unit 232 and a data encoding unit 234.

The communication unit 210 may perform functions for transmitting and receiving signals via a wireless channel. For example, the communication unit 210 may perform a function of converting between a baseband signal and a bit stream according to a physical layer standard of a system. For example, when transmitting data, the communication unit 210 may generate complex symbols by encoding and modulating a transmission bit stream. In addition, when receiving data, the communication unit 210 may restore a reception bit stream by demodulating and decoding a baseband signal. In addition, the communication unit 210 may up-convert a baseband signal into a radio frequency (RF) band signal, and then may transmit the signal via an antenna, and may down-convert an RF band signal received via an antenna into a baseband signal.

To achieve this, the communication unit 210 may include a transmission filter, a reception filter, an amplifier, a mixer, an oscillator, a digital to analog converter (DAC), an analog to digital converter (ADC), etc. In addition, the communication unit 210 may include a plurality of transmission and reception paths. Furthermore, the communication unit 210 may include at least one antenna array including a plurality of antenna elements. In the hardware aspect, the communication unit 210 may be configured by a digital unit and an analog unit, and the analog unit may be configured by a plurality of sub-units according to operating power, an operating frequency, etc.

The communication unit 210 may transmit and receive signals as described above. Accordingly, the communication unit 210 may be referred to as a "transmitter," "receiver," or "transceiver." In addition, in the following description, transmitting and receiving via a wireless channel may be used as a meaning including processing by the communication unit 210 as described above. In addition, the communication unit 210 may further include a backhaul communication unit to communicate with other network entities connected through a backhaul network.

The storage 220 may store data such as a basic program for the operation of the transmission end 110, an application program, configuration information, or the like. The storage 220 may be configured by a volatile memory, a nonvolatile memory, or a combination of a volatile memory and a nonvolatile memory. In addition, the storage 220 may provide stored data according to a request of the controller 230.

The controller 230 controls overall operations of the transmission end 110. For example, the controller 230 may transmit and receive signals via the communication unit 210. In addition, the controller 230 may write or read out data on or from the storage 220. To achieve this, the controller 230 may include at least one processor or a micro processor, or may be a portion of the processor. In other words, the controller 230 may control operations of respective components included in the communication unit 210. According to various embodiments, the controller 230 may control the inactivation sub-block identification unit 232 and the data encoding unit 234. For example, the controller 230 may control the inactivation sub-block identification unit 232 to identify an inactivation sub-block. In an embodiment, the inactivation sub-block may be determined beforehand and may be stored in the storage 220. In addition, the controller 230 may control the data encoding unit 234 to encode data based on the identified sub-block. The controller 230 may control the transmission end to perform operations according to various embodiments, which will be described below.

Figure 3:
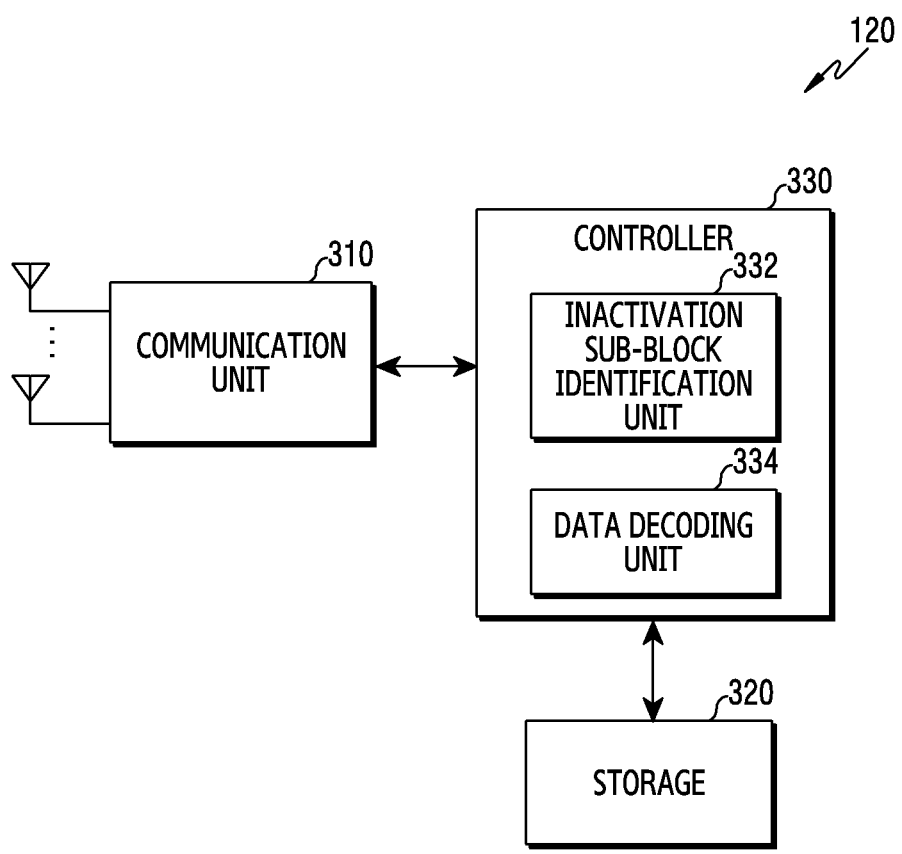
FIG. 3 is a view illustrating an example of a configuration of a reception end device in a wireless communication system according to various embodiments of the disclosure.

FIG. 3 illustrates an example of a configuration of a reception end device in a wireless communication system according to various embodiments of the disclosure. That is, the configuration illustrated in FIG. 3 may be understood as a configuration of the reception end 120. The term "unit" or terms ending with suffixes "-er," and "-or" used in the following description refer to a unit processing at least one function or operation, and may be implemented by hardware, software, or a combination of hardware and software.

Referring to FIG. 3, the reception end 120 may include a communication unit 310, a storage 320, and a controller 330.

The communication unit 310 may perform functions for transmitting and receiving signals via a wireless channel. For example, the communication unit 310 may perform a function of converting between a baseband signal and a bit stream according to a physical layer standard of a system. For example, when transmitting data, the communication unit 310 may generate complex symbols by encoding and modulating a transmission bit stream. In addition, when receiving data, the communication unit 310 may restore a reception bit stream by demodulating and decoding a baseband signal. In addition, the communication unit 310 may up-convert a baseband signal into an RF band signal, and then may transmit the signal via an antenna, and may down-convert an RF band signal received via an antenna into a baseband signal.

To achieve this, the communication unit 310 may include a transmission filter, a reception filter, an amplifier, a mixer, an oscillator, a DAC, an ADC, etc. In addition, the communication unit 310 may include a plurality of transmission and reception paths. Furthermore, the communication unit 310 may include at least one antenna array including a plurality of antenna elements. In the hardware aspect, the communication unit 310 may be configured by a digital unit and an analog unit, and the analog unit may be configured by a plurality of sub-units according to operating power, an operating frequency, etc.

The communication unit 310 may transmit and receive signals as described above. Accordingly, the communication unit 310 may be referred to as a "transmitter," "receiver," or "transceiver." In addition, in the following description, transmitting and receiving via a wireless channel may be used as a meaning including processing by the communication unit 310 as described above. In addition, the communication unit 310 may include a backhaul communication unit to communicate with other network entities connected through a backhaul network.

The storage 320 may store data such as a basic program for the operation of the reception end 120, an application program, configuration information, or the like. The storage 320 may be configured by a volatile memory, a nonvolatile memory, or a combination of a volatile memory and a nonvolatile memory. In addition, the storage 320 may provide stored data according to a request of the controller 330.

The controller 330 may control overall operations of the reception end 120. For example, the controller 330 may transmit and receive signals via the communication unit 310. In addition, the controller 330 may write and read out data on or from the storage 320. To achieve this, the controller 330 may include at least one processor or a micro processor, or may be a portion of the processor. In other words, the controller 330 may control operations of respective components included in the communication unit 310. According to various embodiments, the controller 330 may control an inactivation sub-block identification unit 332 and a data decoding unit 334. For example, the controller 330 may control the inactivation sub-block identification unit 332 to identify an inactivation sub-block. In an embodiment, the inactivation sub-block may be determined beforehand and may be stored in the storage 320. In another embodiment, the reception end 120 may receive information on the inactivation sub-block from the transmission end 110 through the communication unit 310. In addition, the controller 330 may control the data decoding unit 334 to decode data based on the identified sub-block. The controller 330 may control the reception end to perform operations according to various embodiments, which will be described below.

An existing polar code may have low encoding and decoding complexity (with reference to successive cancellation (SC) decoding) of O ($N_{log}N$) if a code length is N. Since the existing polar code thoroughly undergoes a polarization process, the existing polar code is a fully polarized structure where node operations corresponding to all nodes (XOR) are performed. However, technologies for reducing existing operation complexity by reducing unnecessary node operations from among such node operations have been suggested.

Firstly, relaxed polar code technology has been suggested. The relaxed polar code technology may utilize reliability of a bit channel as a reference of relaxation. Similarly to the existing polar code, the relaxed polar code may asymptotically achieve channel capacity in a binary memoryless symmetric (MBS) channel. The relaxed polar code technique may not proceed with polarization anymore when a channel sufficiently becomes better or worse through channel polarization. In general, three scenarios may be considered with respect to a sufficiently good, bad channel in a polar code of a finite length. Herein, a Bhattacharyya parameter is a parameter for determining reliability of a separation channel, and may be defined as an upper bound of a maximum likelihood (ML) error rate when 0 or 1 is transmitted through a channel W. The first scenario is a scenario that relaxes sufficiently good channels (good-channel relaxed polarization (GC-RP)). In this case, when a Bhattacharyya parameter value ($Z_{i,t}$) of the i-th node at the t-th polarization step is less than a reference threshold value ($T_g$) regarding sufficiently good channels, the polarization may not proceed anymore and may be stopped. The second scenario is a scenario that relaxes sufficiently bad channels (bad-channel relaxed polarization (BC-RP)). In this case, when the Bhattacharyya parameter value ($Z_{i,t}$) of the i-th node at the t-th polarization step (polarization level: t) exceeds a reference threshold value ($T_b$) regarding sufficiently bad channels, the polarization may not proceed anymore and may be stopped. The third scenario is a scenario that relaxes both sufficiently good channels and sufficiently bad channels (all-channel relaxed polarization (AC-RP)).

Secondly, irregular polar code technology has been suggested. Differences between the above-described relaxed polar code and the irregular polar code will be described below. In various embodiments, channel polarization may occur as a check node (CN) operation and a variable node (VN) operation of a log likelihood ratio (LLR) are repeatedly performed from a codeword vector end. In the case of a relaxed polar code, polarization units positioned at the right end may not be relaxed if they do not meet a specific threshold value condition. On the other hand, the irregular polar code was suggested to overcome restrictions on a reference for selecting a relaxing position at the relaxed polar code. In various embodiments, inactivation of a polarization unit may be referred to as "relax" in the case of the relaxed polar code, and may be referred to as "inactivation" in the case of the irregular polar code. Since the irregular polar code does not have restrictions on a position of the polarization unit to be inactivate, a polarization unit at any of a source bit end or a codeword end may be inactivated.

Therefore, in the case of the irregular polar code, combinations of all polarization units to be inactivated may be considered, and an inactivation pattern having an optimal word error rate (WER) may be selected from these combinations. For example, when successive cancellation (SC) decoding is performed, the WER may be defined as shown in Equation 1:

$$P_\epsilon = 1 - \prod_{i \in \mathcal{K}} \left(1 - \frac{z_i^{[0]}}{2}\right) < \sum_{i \in \mathcal{K}} \frac{z_i^{[0]}}{2} \qquad \text{Equation 1}$$

In Equation 1, $P_\epsilon$ is a block error rate when SC decoding is performed, $Z_i^{[0]}$ is the i-th Bhattacharyya parameter value at a source bit end, and K is a set of information bit indexes.

When the above-described Equation 1 is applied to a binary eraser channel, a WER according to an inactivation pattern may be identified at a code length N=4, which is a relatively simple pattern. For example, if it is assumed that an index of a polarization unit between a source bit end and a codeword bit end is U(a, b), U(a, b) may refer to a polarization unit at the a-th end from the source bit end and at the b-th end from the top. In this case, when the U(1, 1) polarization unit is inactivated at a binary eraser channel (BEC) the number of information bits of which is 2, the WER value may be 0.2432, when the U(1, 2) polarization unit is inactivated, the WER value may be 0.2383, when the U(2, 1) polarization unit is inactivated, the WER value may be 0.2344, and, when the U(2, 2) polarization unit is inactivated, the WER value may be 0.2383. In this way, the irregular polar code technique may obtain an inactivation pattern showing the best error rate performance through a greedy search method.

As described above, the relaxed polar code technique may use a threshold value of the Bhattacharyya parameter value indicating reliability of separation channels, and, when the Bhattacharyya parameter value exceeds a reference threshold value or is less than the reference threshold value, this method does not proceed with polarization anymore. In addition, the irregular polar code technique may enhance a WER and may reduce operation complexity, but may find an inactivation pattern having optimal performance according to the number of inactivated polarization units through an exhaustive search. Therefore, there is a disadvantage that a generator matrix should be newly stored every time and much memory quantity is consumed.

Figure 4A:
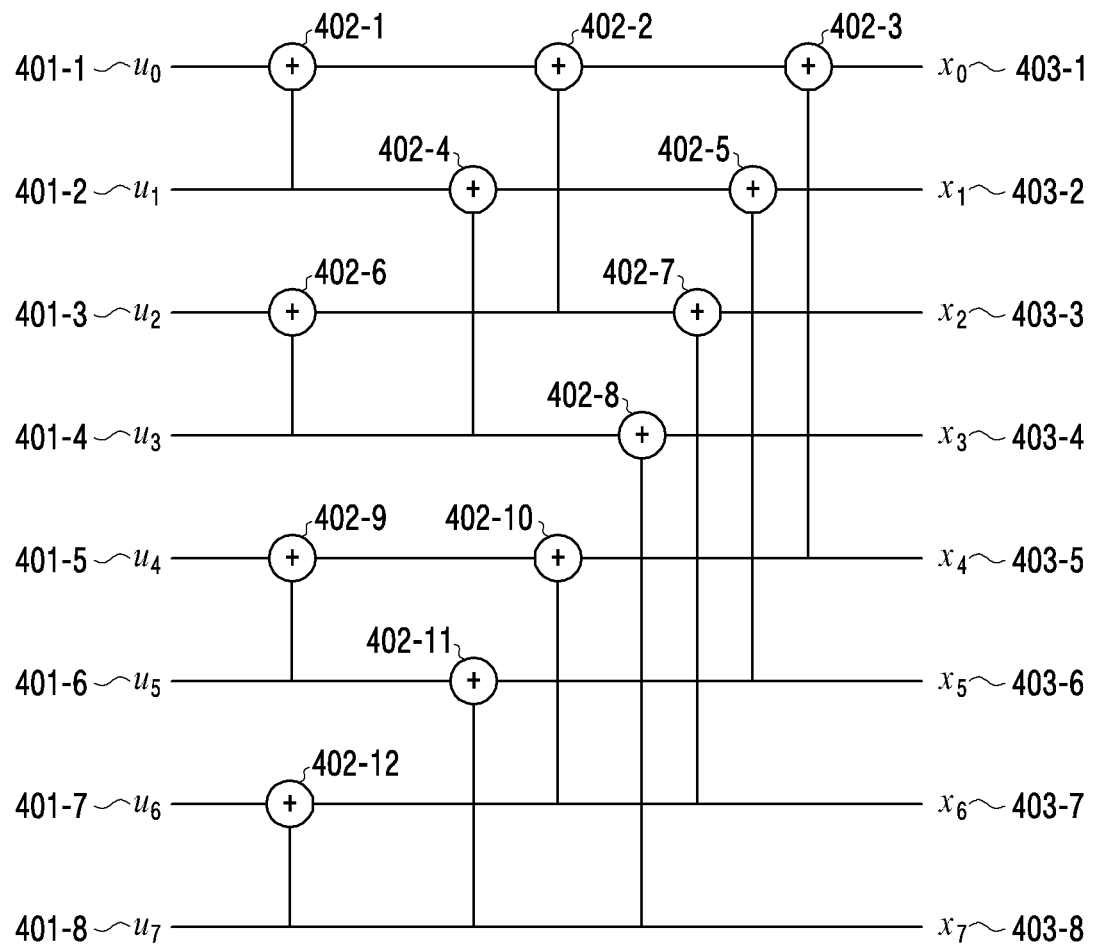
FIG. 4A is a view illustrating an example of a regular polar code method in a wireless communication system according to various embodiments of the disclosure.
Figure 4B:
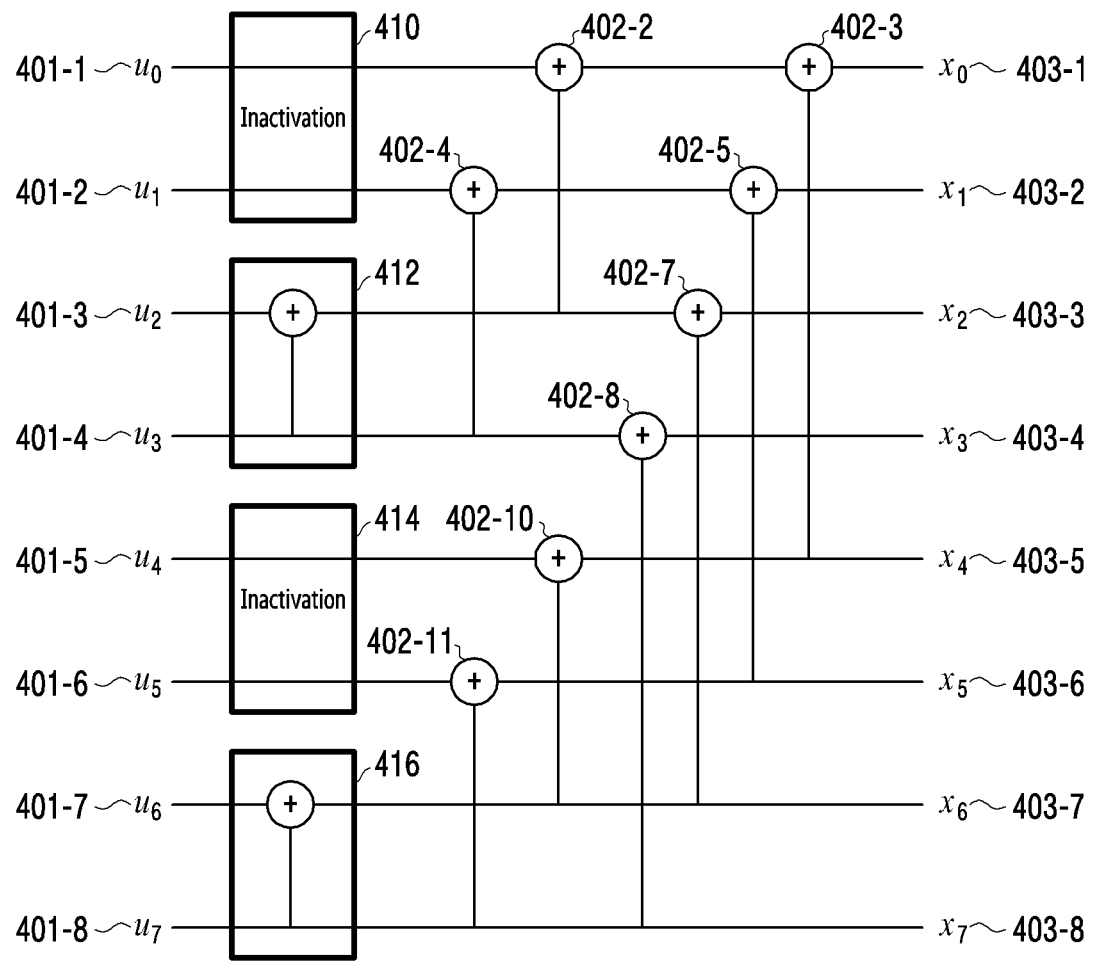
FIG. 4B is a view illustrating an example of a block-wise polar code method according to a size of a sub-block in a wireless communication system according to various embodiments of the disclosure.
Figure 4C:
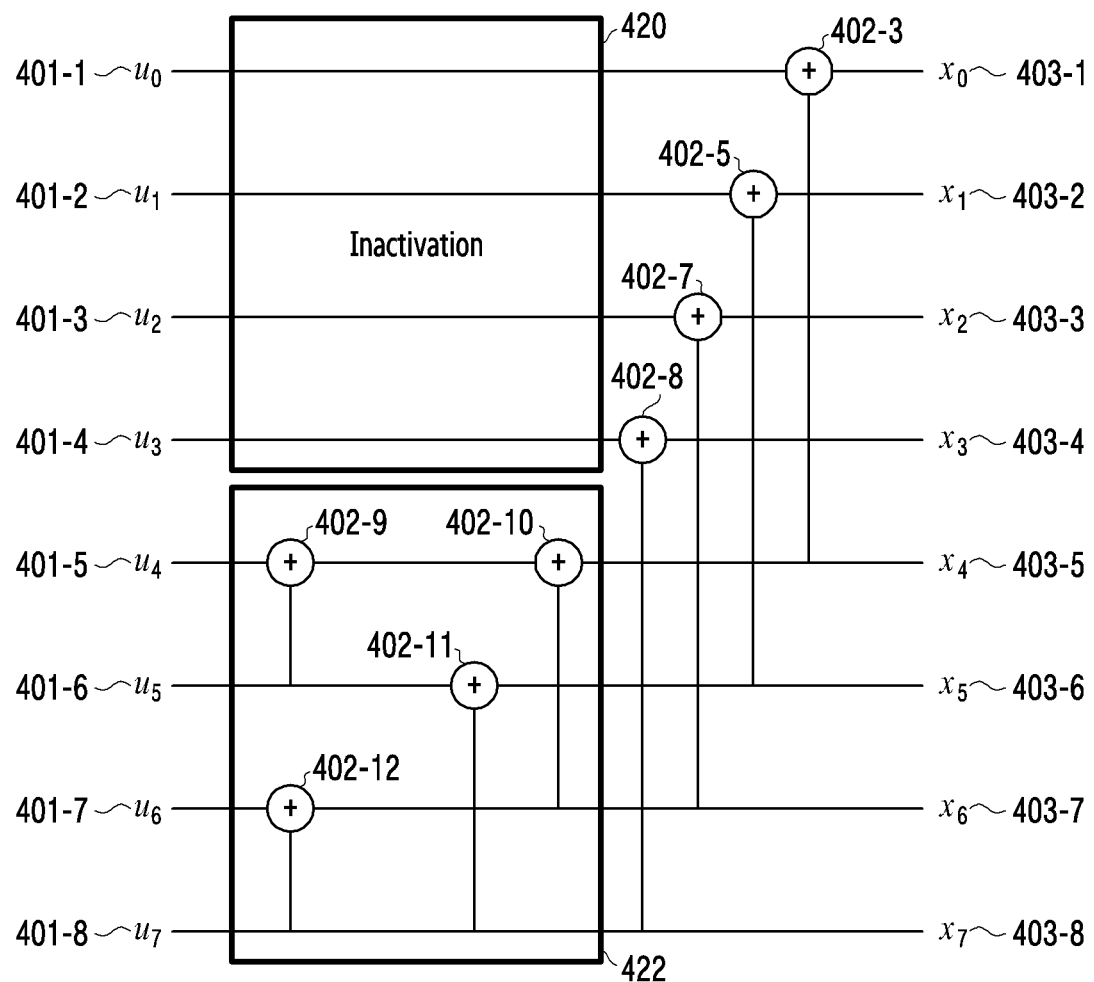
FIG. 4C is a view illustrating an example of a block-wise polar code method according to a size of a sub-block in a wireless communication system according to various embodiments of the disclosure.

Accordingly, the disclosure suggests a method for reducing operation complexity without losing performance, by dividing an entire block including a polarization unit into sub-blocks, and inactivating all of node operations in the sub-blocks, in order to overcome the disadvantages of the relaxed polar code technique and the irregular polar code technique described above. First, comparison of an existing regular polar code technique and a block-wise irregular polar code technique is illustrated in FIGS. 4A to 4C. In various embodiments of the disclosure, a source bit may be referred to as an information bit.

FIG. 4A illustrates an example of a regular polar code method in a wireless communication system according to various embodiments of the disclosure. Referring to FIG. 4A, source bits $u_0$ to $u_7$ 401-1 to 401-8 are calculated through polarization units 402-1 to 402-12, and are encoded into codeword bits $x_0$ to $x_7$ 403-1 to 403-8. FIG. 4A illustrates a regular polar code technique by which bit reversal does not occur if a code length (N) of a polar code is 8. Such a regular polar code technique may be referred to as a fully polarized structure. The block-wise irregular polar code technique suggested in the disclosure provides a concept of a sub-block, and the polar code technique introducing the concept of the sub-block is illustrated in FIGS. 4B and 4C.

FIG. 4B illustrates an example of a block-wise polar code method according to a size of a sub-block in a wireless communication system according to various embodiments of the disclosure.

Referring to FIG. 4B, a size ($N_{sub}$) of a sub-block may be defined as $2_t$ (t≤n) if a size N of an entire block is $2^n$. For example, since the size of the entire block is 8 in FIG. 4B, n may be 3 and the size of the sub-block may be 1, 2, 4 or 8. In the case of FIG. 4B, the size of the-sub-block is 2. In various embodiments, a transmission end may define sub-blocks 410, 412, 414, and 416 including polarization units. In this case, the transmission end may reduce operation complexity by inactivating at least one of the sub-blocks. For example, the transmission end may reduce operation complexity by not performing a node operation with respect to polarization units 402-1 and 402-9 included in the sub-block 410, the sub-block 414, respectively. In various embodiments, inactivation of sub-blocks may be performed at a position closest to a source vector end. That is, sub-block inactivation may be performed with respect to a sub-block including a polarization unit closest to a source vector end from among polarization units. The transmission end inactivates the sub-block 410 and the sub-block 414, such that a node operation is not performed with respect to two polarization units 402-1 and 402-9 from among 12 polarization units in total. By doing so, calculation complexity may be reduced by 16.67% in comparison with a node operation of a regular polar code. If the size of the sub-block is 4 in the same code length as in FIG. 4B, an example of sub-block inactivation may be as shown in FIG. 4C.

FIG. 4C illustrates an example of a block-wise polar code method according to a size of a sub-block in a wireless communication system according to various embodiments of the disclosure.

Referring to FIG. 4C, the size of the sub-block may be 4 and sub-blocks 420 and 422 may be defined. In various embodiments, the sub-block 420 may include polarization units 402-1, 402-2, 402-4, and 402-6, and the sub-block 422 may include polarization units 402-9, 402-10, 402-11, and 402-12. When the transmission end inactivates the sub-block 420, a node operation may not be performed in the polarization units 402-1, 402-2, 402-4, and 402-6. As the sub-block 420 is inactivated, decoding corresponding to source bits $u_0$ to $u_3$ may be performed at a time. That is, since the node operation is not performed with respect to the polarization units 402-1, 402-2, 402-4, and 402-6 included in the sub-block 420, when decoding proceeds from the code bit end to the source bit end, LLR values corresponding to $u_0$ to $u_3$ before the decoding enters the sub-block 420 may be used directly for decoding of the source bits. In addition, since sorting of inactivation sub-blocks or list decoding is not necessary, operation complexity and a delay time may be reduced. The process of encoding and decoding through sub-block inactivation as described above is illustrated in a block diagram of FIG. 5.

Figure 5:
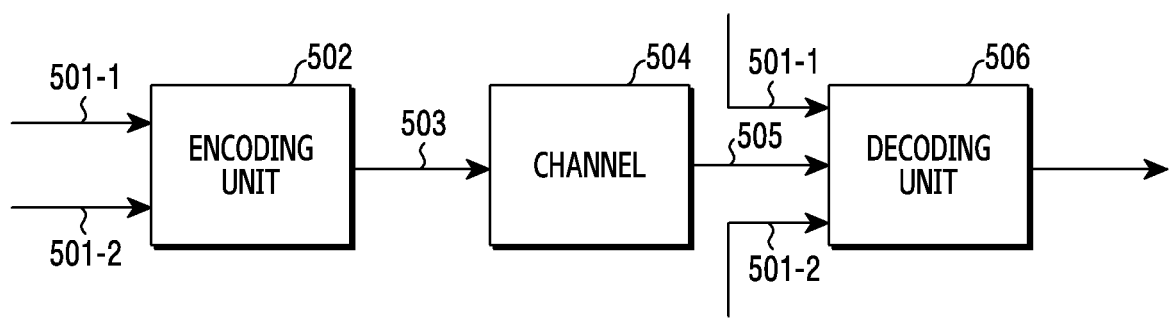
FIG. 5 is a view illustrating functional configurations of a transmission end and a reception end which perform encoding and decoding of a block-wise polar code in a wireless communication system according to various embodiments of the disclosure.

FIG. 5 illustrates functional configurations of a transmission end and a reception end which perform encoding and decoding of a block-wise polar code in a wireless communication system according to various embodiments of the disclosure. An encoding unit 502 illustrated in FIG. 5 may be included in the transmission end 110 of FIG. 1, and a decoding unit 506 may be included in the reception end 120 of FIG. 1.

Referring to FIG. 5, indexes of information bits may be determined based on an index sequence of a polar code, and a code rate. An index set 501-1 of the determined information bits may be inputted to the encoding unit 502. In addition, index information 501-2 of an inactivated sub-block may be inputted to the encoding unit 502. The encoding unit 502 may newly define a generator matrix of the polar code, based on the index set 501-1 of the inputted information bits, and the index information 501-2 of the inactivated sub-block. If a generator matrix of a regular polar code is $G_N$, a codeword vector (x) may be determined by the product of a source bit vector (u) and the generator matrix ($G_N$), that is, an encoding equation like $x=uG_N$. However, when a node operation in a sub-block is not performed through sub-block inactivation, the codeword vector (x) may be determined by the product of the source bit vector (u) and a modified generator matrix ($G_{mod}$), that is, $x=uG_{mod}$. As described above, a codeword 503 generated by multiplying by the modified matrix generator may pass through a channel 504, and a codeword 505 passing through the channel may be inputted to the decoding unit 506. In this case, the index set 501-1 of the information bits which has been used for encoding, and the index information 501-2 of the inactivated sub-block may be inputted to the decoding unit 506. In an embodiment, when the decoding unit 506 already knows information on the index set of the information bits and the index information of the inactivated sub-block, the above-described input process may be omitted.

The decoding unit 506 may decode the codeword 505 passing through the channel, based on the inputted information. Through this, operation complexity may be reduced. In various embodiments of the disclosure, when a SC decoding technique is used at a reception end, a specific algorithm of a decoding process of a block-wise irregular polar code technique is as shown in Table 1.

TABLE 1

With respect to a code length N, a code rate R(=K/N),
1: Define polar code index sequence $\mathcal{S} = (s_1, s_2, ..., s_{N-K+1}, ..., s_N)$
2: Information bit index sequence $\mathcal{B} = (s_{N-K+1}, ..., s_N)$
3: for i = 0: N − 1
4:   if i ∈ $\mathcal{B}$ then $C_i = 1$
5:   else  then $C_i = 0$
6:   end if
7: end for
8:   for $j = 0: \dfrac{N}{N_{sub}} - 1$
9:   if $\sum_{k=0}^{N_{sub}-1} C[j \cdot N_{sub} + k] \mod N_{sub} = 0$
10:     then $\mathcal{D}[j] = 1$
11:   else
12:     $\mathcal{D}[j] = 0$
13:   end if
14: end for
15: UpdateGeneratorMatrix(G)
16: $\underline{x} = \underline{u}G_{mod}$ Referring to table 1, with respect to a code length N, a code rate (R=K/N), a polar code index sequence S is defined. A transmission end may generate a set of a sequence C in which 1 (on) is displayed with respect to an index included in a set of an information bit index sequence B, and 0 (off) is displayed with respect to an index that is not included in the set of the information bit index sequence B, while increasing indexes from 0 to N−1 on the 3rd line to the 5th line of the algorithm. The sequence C indicate an on-off vector that displays an information bit as 1 and displays a frozen bit as 0. The transmission end may generate an index sequence D of a sub-block to be inactivated on the 8th line to the 14th line of the algorithm. For example, the transmission end may determine sub-blocks formed only of frozen bits or information bits as inactivation sub-blocks, and may set an element value in a sequence in a sub-block index corresponding to the inactivation sub-blocks to 1. The transmission end may set an element value in a sequence in a sub-block index corresponding to the other sub-blocks which are not inactivated to 0. The transmission end may update the generator matrix (G), based on the index sequence of the sub-block to be inactivated. That is, the transmission end may update the generator matrix (GN) of the regular polar code to the modified generator matrix ($G_{mod}$). The transmission end may acquire the codeword vector (x) by encoding the source bit vector (u) through the modified generator matrix. The UpdateGeneratorMatrix (G) function on the 15th line of Table 1 is a function indicating modification of an existing generator matrix according to a method of selecting an inactivated sub-block, and a detailed algorithm thereof is as shown in Table 2.

TABLE 2

```
1: def step(F, N_sub, D )
2:     size = len(F) / N_sub
3:     for k = 0: len( D )-1
4:         if D[k] = 1
5:             for j = 0 :len(N_sub)
6:                 FtoIdentity(F, size, k*size, j*size)
7: def FtoIdentity(matrix, size, x, y)
8:     if matrix[x][y] = 0
9:         return
10:    for i = 0: len(size)
11:        for j = 0: len(size)
12:            matrix[x+i][y+j] = 0;
13:            if i = j
14:                matrix[x+i][y+j] = 1;
15: return matrix
```

Referring to Table 2, the transmission end may define a generator matrix (F), a size of a sub-block ($N_{sub}$), and an index (D) of a sub-block to be inactivated. In addition, the transmission end may divide a size of the generator matrix (len(F)) by the size of the sub-block, and may define the result of division as a size. In addition, while an index k increases from 0 to the number of sub-blocks-1 (len(D)−1), the transmission end may replace a unit generator matrix $$\left(F = \begin{pmatrix} 1 & 0 \\ 1 & 1 \end{pmatrix}\right)$$

kernel with a unit matrix in the case of an inactivation sub-block (D[k]=1).

Figure 6:
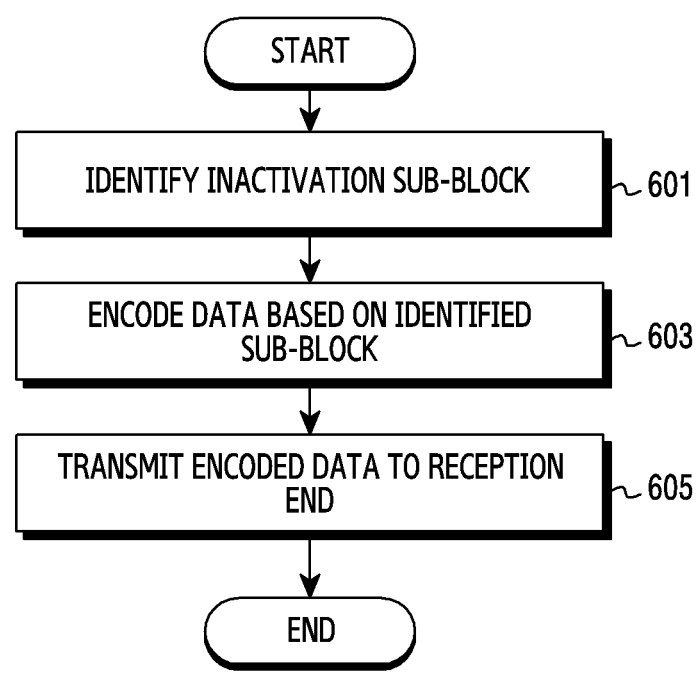
FIG. 6 is a flowchart of a transmission end which performs encoding based on an inactivation sub-block in a wireless communication system according to various embodiments of the disclosure.

FIG. 6 is a flowchart of a transmission end which encodes based on an inactivation sub-block in a wireless communication system according to various embodiments of the disclosure. FIG. 6 illustrates an example of an operating method of the transmission end 110 of FIG. 1.

Referring to FIG. 6, at step 601, the transmission end identifies an inactivation sub-block. For example, the transmission end may identify an index of a sub-block that is determined to be inactivated according to a method of determining an inactivation sub-block, which will be described below. In various embodiments, a sub-block formed only of frozen bits may be inactivated regardless of the number of sub-blocks or a decoding method. In the case of a sub-block formed only of information bits, an inactivation method may be different according to a decoding method or reliability of the sub-block. In various embodiments, the sub-block to be inactivated may be already determined and may be stored in a storage of the transmission end.

At step 603, the transmission end encodes data based on the identified sub-block. For example, the transmission end may generate an index sequence of the sub-block to be inactivated, and may determine a modified generator matrix from a generator matrix of a regular polar code, based on the index sequence of the sub-block to be inactivated. The transmission end may encode data by generating a codeword by multiplying the modified generator matrix by an information bit.

Figure 7:
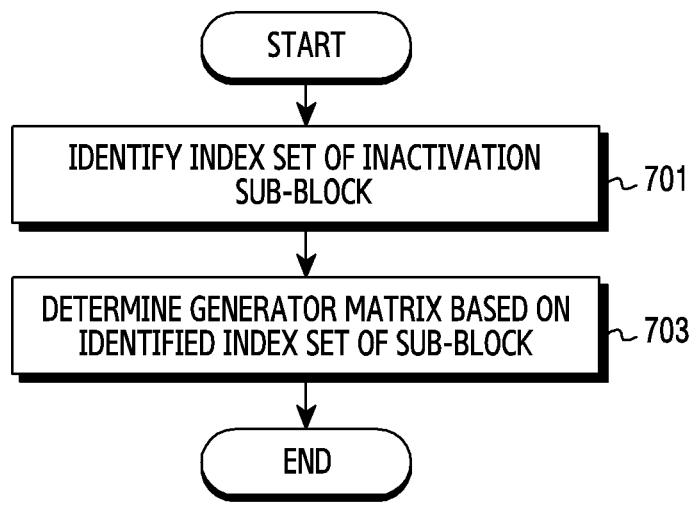
FIG. 7 is a flowchart of a transmission end which determines a modified generator matrix in a wireless communication system according to various embodiments of the disclosure.

At step 605, the transmission end transmits the encoded data to a reception end. For example, the transmission end may transmit the information bit that is encoded through the modified generator matrix, that is, the codeword, to the reception end. In this case, the codeword passing through a channel may be received at the reception end, and the codeword may be decoded based on the index of the information bit and the index of the sub-block to be inactivated. In various embodiments, the transmission end may generate the modified generator matrix reflecting the inactivation of the sub-block prior to encoding the data. FIG. 7 illustrates a process of determining a modified generator matrix by identifying an index of an inactivation sub-block.

FIG. 7 is a flowchart of a transmission end which determines a modified generator matrix in a wireless communication system according to various embodiments of the disclosure. FIG. 7 illustrates an operating method of the transmission end 110 of FIG. 1.

Referring to FIG. 7, at step 701, the transmission end may identify an index set of an inactivation sub-block. In various embodiments, a size of an index set (D) of a sub-block to be inactivated may be determined based on a code length (N), and a size of a sub-block ($N_{sub}$). For example, if the code length is 8 and the size of the sub-block is 2, the size of the index set of the inactivation sub-block may be determined as 4. In this case, in the index set of the inactivation sub-block having the size of 4, a value of an element corresponding to an index of an inactivated sub-block may be set to 1, and a value of an element corresponding to an index of a sub-block that is not inactivated may be set to 0. The transmission end may identify the index set of the inactivation sub-block having such an element.

Figure 8A:
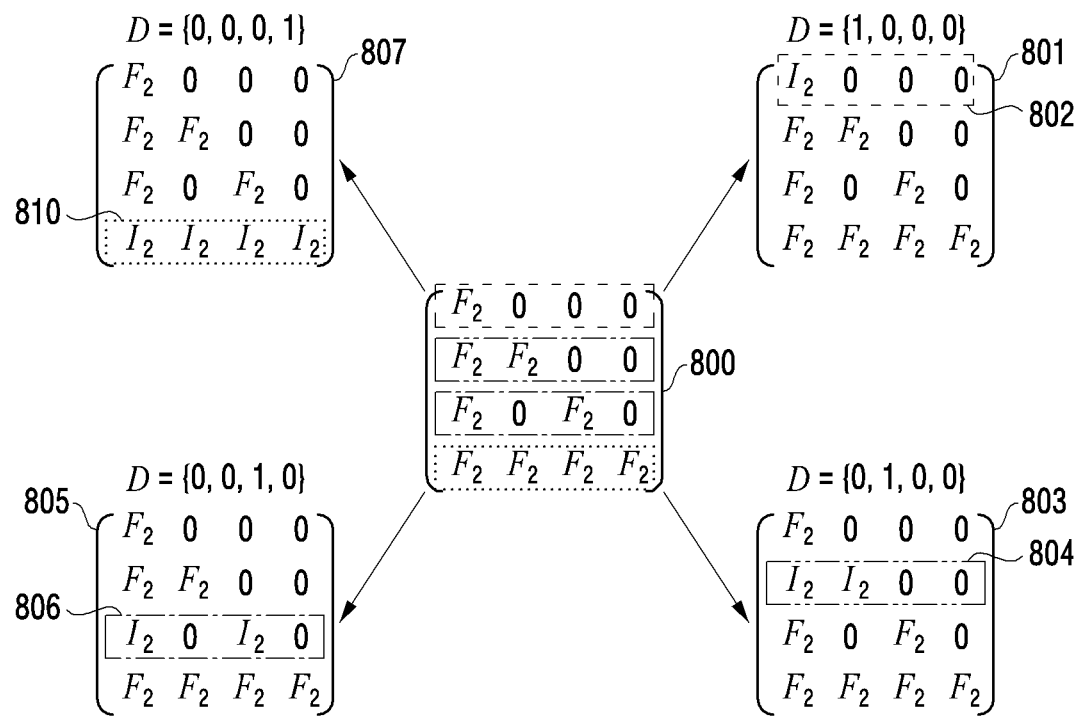
FIG. 8A is a view illustrating an example of determining a generator matrix according to an index of an inactivated sub-block in a wireless communication system according to various embodiments of the disclosure.
Figure 8B:
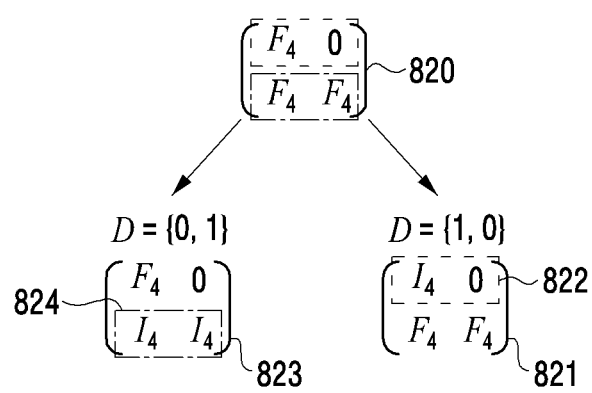
FIG. 8B is a view illustrating an example of determining a generator matrix according to an index of an inactivated sub-block in a wireless communication system according to various embodiments of the disclosure.

At step 703, the transmission end determines a generator matrix based on the identified index set of the sub-block. In various embodiments, the transmission end may generate a modified generator matrix by changing a configuration of a normal generator matrix according to a position of an element 1 included in the index set of the inactivation sub-block. For example, FIG. 8A illustrates an example of determining a modified generator matrix according to an index of an inactivated sub-block if a size of a sub-block is 2. Referring to FIG. 8A, if a code length (N) is 8 and a size of a sub-block is 2, a generator matrix $G_8$ of the existing normal code length of 8 may be expressed by $$G_8 = F_2^{\otimes 3}\left(F_2 = \begin{pmatrix} 1 & 0 \\ 1 & 1 \end{pmatrix}\right),$$

which is the same as a generator matrix 800 of FIG. 8A. In this case, since the size of the sub-block is 2, the size of the index set of the inactivation sub-block is 4. In various embodiments, the generator matrix 800 may be modified according to a position of the element 1 included in the index set of the inactivation sub-block. For example, in FIG. 8A, the generator matrix 800 may be modified to four types in total. For example, if the first element value of the index set of the inactivation sub-block is 1 (D={1,0,0,0}), the $F_2$ matrix of the first row 802 of the generator matrix 800 is replaced with a unit matrix $I_2$, such that a modified generator matrix 801 is determined. In addition, if the second element value of the index set of the inactivation sub-block is 1 (D={0,1,0,0}), the $F_2$ matrixes of the second row 804 of the generator matrix 800 are replaced with the unit matrix $I_2$, such that a modified generator matrix 803 is determined. In addition, if the third element value of the index set of the inactivation sub-block is 1 (D={0,0,1,0}), the $F_2$ matrixes of the third row 806 of the generator matrix 800 are replaced with the unit matrix $I_2$, such that a modified generator matrix 805 is determined. In addition, if the fourth element value of the index set of the inactivation sub-block is 1 (D={0,0,0,1}), the $F_2$ matrixes of the fourth row 808 of the generator matrix 800 are replaced with the unit matrix $I_2$, such that a modified generator matrix 807 is determined. According to various embodiments, if the size of the sub-block is 4, the generator matrix $G_8$ of the existing normal code length of 8 may be expressed by $G_8=F_4^{\otimes 2}$, which is the same as a generator matrix 820 of FIG. 8B. In this case, since the size of the sub-block is 4, the size of the index set of the inactivation sub-block is 2. In various embodiments, the generator matrix 820 may be modified according to a position of the element 1 included in the index set of the inactivation sub-block. For example, in FIG. 8B, the generator matrix 820 may be modified in two types in total. For example, if the first element value of the index set of the inactivation sub-block is 1 (D={1,0}), the $F_4$ matrix of the first row 822 of the generator matrix 820 is replaced with a unit matrix $I_4$, such that a modified generator matrix 821 is determined. In addition, if the second element value of the index set of the inactivation sub-block is 1 (D={0,1}), the $F_4$ matrixes of the second row 824 of the generator matrix 820 are replaced with the unit matrix $I_4$, such that a modified generator matrix 823 is determined. In various embodiments, the index set of the inactivation sub-block, the modified generator matrix may be already determined and may be stored in the storage of the transmission end.

As described above, the transmission end may encode data by using the determined generator matrix. A decoding process performed at a reception end in response to the encoding process of the transmission end will be described with reference to FIG. 9.

Figure 9:
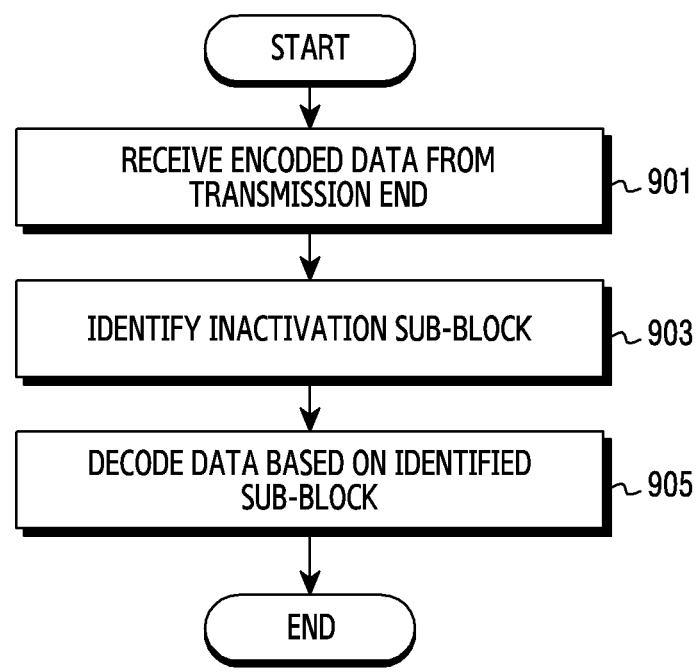
FIG. 9 is a flowchart of a reception end which performs decoding based on an inactivation sub-block in a wireless communication system according to various embodiments of the disclosure.

FIG. 9 is a flowchart of a reception end which decodes based on an inactivation sub-block in a wireless communication system according to various embodiments of the disclosure. FIG. 9 illustrates an operating method of the reception end 120 of FIG. 1.

Referring to FIG. 9, at step 901, the reception end receives encoded data from a transmission end. For example, the reception end may receive a codeword transmitted from the transmission end and passing through a channel. In various embodiments, the codeword may refer to an information bit that is encoded through a modified generator matrix.

At step 903, the reception end identifies an inactivation sub-block. In various embodiments, the reception end may identify an inactivation sub-block based on an index of the inactivation sub-block. For example, if a value of an element included in an inactivation sub-block index set is 1, a sub-block having the corresponding index is an inactivated sub-block, and, if a value of an element included in the inactivation sub-block index set is 0, a sub-block having the corresponding index may be a sub-block that is not inactivated. In an embodiment, the set including the index of the inactivation sub-block may be pre-stored in a storage of the reception end. In another embodiment, the transmission end may receive information on the set including the index of the inactivation sub-block from the reception end.

At step 905, the reception end decodes data based on the identified sub-block. In various embodiments, the reception end may perform a check node operation (CN op) or a variable node operation (VN op) based on indexes of source bits, that is, information bits, and may decode data by performing LLR updating based on the index of the sub-block identified as being inactivated. For example, when an SC decoding technique is used at the reception end, a specific algorithm of a decoding process of a block-wise irregular polar code technique is as shown in Table 3.

TABLE 3

Require: Channel LLRs, set of information index

```
 1: for i = 1 : N
 2:    Binary expression regarding MSB-0: (i-1) of
       a length of func ← log₂N
 3:    Binary expression regarding stage ← index of
       first '1' in log₂N-bit MSB-0: (i-1)
 4:       (if i=1 then stage ← log₂N)
 5:    for s = stage : (log₂N_sub) + 1
 6:       for p_s = 1: 2^(s-1)
 7:          if func(s) = 0 then
 8:             LLR(w) ← f(LLR(a), LLR(b))
 9:          else
10:             LLR(w) ← g(LLR(a), LLR(b), )
11:          endif
12:       end for
13:    end for
14:    for s = log₂N_sub : 1
15:       if 𝒟(j) = 1
16:          LLR updating is not performed anymore.
17:       else
18:          repeat line 6 - line 12
19:       end if
20:    end for
21:    if i ∈ 𝒥^c
22:       û_i ← u_i
23:    else
24:       if LLR(w)>0
25:          then set û_i to 0
26:       else
27:          set û_i to 1
28:       end if
29:    end if
30: end for
```

Referring to Table 3, in binary expressions of indexes of all information bits (u), a check node operation may be performed with respect to an index corresponding to 0, and a variable node operation may be performed with respect to an index corresponding to 1. For example, referring to the 8$^{th}$ line of the algorithm of Table 3, a check node operation expressed by an f function may be performed with respect to LLR values regarding codeword bits a and b. In addition, referring to the 10th line of the algorithm of Table 3, a variable node operation expressed by a g function may be performed with respect to the LLR values regarding the codeword bits a and b. Referring to the 15th line to the 18th line of the algorithm of Table 3, if an element of the inactivation sub-block index set is 1 (D(j)=1), that is, if there is an inactivated sub-block, the reception end may not perform LLR updating. To the contrary, if an element of the inactivation sub-block index set is not 1, that is, if there is an activated sub-block, operations corresponding to the $6^{th}$ line to the $12^{th}$ line may be repeated. That is, LLR updating for the remaining stages may be performed. Examples of the check node operation and the variable node operation explained in the algorithm of Table 3 are as shown in FIG. 10, which will be described below.

Figure 10:
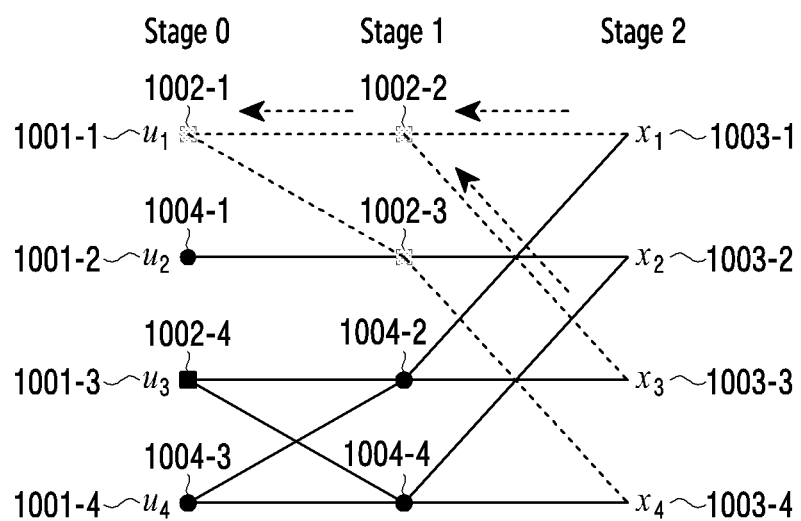
FIG. 10 is a view illustrating an example of operations of a check node and a variable node in a wireless communication system according to various embodiments of the disclosure.

FIG. 10 is a view illustrating examples of operations of a check node and a variable node in a wireless communication system according to various embodiments of the disclosure.

Referring to FIG. 10, codeword bits $x_1$ to $x_4$ 1003-1 to 1003-4 may be decoded into source bits $u_1$ to $u_4$ 1001-1 to 1001-4 by passing through stage 2, stage 1, stage 0. In FIG. 10, squares 1002-1, 1002-2, 1002-3, and 1002-4 indicate a check node operation, and circles 1004-1, 1004-2, 1004-3, and 1004-4 indicate a variable node operation. First, if indexes of the source bits are expressed by the binary system, {00, 01, 10, 11} may be expressed for $u_1$, $u_2$, $u_3$, $u_4$ in sequence. In this case, if an index of source bits expressed by the binary system is 0, the index may indicate a check node operation, and, if the index is 1, the index may indicate a variable node operation. For example, in the case of the source bit $u_1$ 1001-1, since a check node operation is performed at the check node 1002-1 of the stage 0 with respect to LLR values calculated from the check nodes 1002-2 and 1002-3 of the stage 1, the source bit $u_1$ 1001-1 may be expressed by {00}. In addition, in the case of the source bit $u_2$ 1001-2, since a variable node operation is performed at the variable node 1004-1 of the stage 0 with respect to LLR values calculated from the check nodes 1002-2 and 1002-3 of the stage 1, the source bit $u_2$ 1001-2 may be expressed by {01}.

In various embodiments, a function of the check node operation may be defined as shown in Equation 2.

$$f(a, b) = 2\tanh^{-1}\left(\tanh\left(\frac{a}{2}\right)\tanh\left(\frac{b}{2}\right)\right) \quad \text{Equation 2}$$

In Equation 2, a and b indicate LLR values of codeword bits, and f(a,b) indicates a check node operation function regarding the inputs a and b. For example, if codeword bits are $x_1$ and $x_2$, a may refer to an LLR value corresponding to the codeword bit $x_1$, and b may refer to an LLR value corresponding to the codeword bit $x_2$. In various embodiments, a function of the variable node operation may be defined as shown in Equation 3.

$$g(a,b,u)=(-1)^u a+b \quad \text{Equation 3}$$

In Equation 3, a and b indicate LLR values of codeword bits. For example, if codeword bits are $x_1$ and $x_2$, a may refer to an LLR value corresponding to the codeword bit $x_1$, and b may refer to an LLR value corresponding to the codeword bit $x_2$. u refers to a binary bit value for which hard decision is made, and may have a different value at each stage. In various embodiments, u may have 0 or 1. g(a,b,u) indicates a variable node operation function if an input is a, b, u.

In various embodiments, while the codeword bits 1003-1 to 1003-4 of the stage 2 move toward the source bits 1001-1 to 1001-4 of the stage 0, LLR values may be updated, and decoding may be performed according to code information of LLR values at the final source bit end, and the presence/absence of a frozen bit or an information bit. That is, as explained on the $14^{th}$ line to the $20^{th}$ line of Table 3, if a size of a sub-block is already determined, the reception end may update LLR values through a check node or variable node operation from a codeword end toward a source bit end in sequence until a specific stage ($\log_2 N_{sub}$) comes. In this case, the reception end may stop updating the LLR value with respect to an inactivation sub-block, and may directly determine a source bit value based on an LLR value calculated at the corresponding end.

In various embodiments of the disclosure, when a SC-list (SCL) decoding technique is used at the reception end, a specific algorithm of an encoding process of a block-wise irregular polar code technique is as shown in Table 4.

TABLE 4

With respect to a code length N, a code rate R(=K/N)
1: Define polar code index sequence $\mathcal{S} = (s_1, s_2, ..., s_{N-K+1}, ..., s_N)$
2: Information bit index sequence $\mathcal{B} = (s_{N-K+1}, ..., s_N)$
3: Sub-block degree-weight sequence $\mathcal{E} = \left(w_0, w_1, ..., w_{\frac{N}{N_{sub}}-1}\right)$
4: for i = 0: N − 1
5:   if i ∈ $\mathcal{B}$ then $C_i$ = 1
6:   else   then $C_i$ = 0
7:   end if
8: end for
9: for $j = 0: \frac{N}{N_{sub}} - 1$
10:   if $\sum_{k=0}^{N_{sub}-1} C[j \cdot N_{sub} + k] \bmod N_{sub} = 0$
11:     if $C[j \cdot N_{sub}] = 0$ then $\mathcal{D}[j] = 1$
12:     else
13:       $w_i$ large sub-block && $\mathcal{D}_{i-1} = 0$ then $\mathcal{D}_i = 0$
14:       $w_i$ large sub-block && $\mathcal{D}_{i-1} = 1$ then $\mathcal{D}_i = 1$
15:     end if
16:   else
17:     $\mathcal{D}[j] = 0$
18:   end if
19: end for
20: UpdateGeneratorMatrix(G)
21: Encode again through $\underline{x} = \underline{u}G_{mod}$ // modified generator matrix Referring to table 4, with respect to a code length N, a code rate (R=K/N), a polar code index sequence A is defined. The transmission end generates a sequence C that displays 1 (on) with respect to an index included in a set of an information bit index sequence B, and displays 0 (off) with respect to an index that is not included in the set of the information bit index sequence B, while increasing the index from 0 to N−1 on the $4^{th}$ line to the $6^{th}$ line of the algorithm. The sequence C indicates an on-off vector that displays an information bit as 1 and a frozen bit as 0. On the $11^{th}$ line of the algorithm, the transmission end may inactivate a sub-block formed only of frozen bits, and, on the $12^{th}$ line, may conditionally inactivate a sub-block formed only of information bits. That is, when an SC list decoding technique is used, an inactivation condition for a sub-block formed only of information bits may be added in comparison to an SC decoding technique. For example, the transmission end may acquire a sum of the number of all 1s of rows of a generator matrix corresponding to bits within a sub-block, that is, a block-degree weight. In this case, a sequence regarding a block-degree weight corresponding to each sub-block may be expressed by E. Referring to the $13^{th}$ line to the $17^{th}$ line of the algorithm, in the case of a sub-block formed only of information bits, the transmission end may inactivate sub-blocks in sequence from the sub-block having a large block-degree weight. In this case, when a sub-block formed of frozen bits and information bits or of frozen bits, and a sub-block formed only of information bits are connected to a polarization unit at the next depth, the corresponding sub-block may not be inactivated. As described above, the transmission end may inactivate all of the sub-blocks formed only of frozen bits, and may activate a sub-block including both frozen bits and information bits. Through this, the transmission end may determine a modified generator matrix ($G_{mod}$), and may perform data encoding.

In addition, in various embodiments of the disclosure, when an SC-list (SCL) decoding technique is used at the reception end, a specific algorithm of a decoding process of a block-wise irregular polar code technique is as shown in Table 5.

TABLE 5

Require: Channel LLRs, set of information index

```
 1: for i = 1 : N
 2:   Binary expression regarding MSB-0: (i-1) of
        a length of func ← log₂N
 3:   Binary expression regarding stage ← index of
        first '1' in log₂N-bit MSB-0: (i-1)
 4:     (if i=1 then stage ← log₂N)
 5:   for l=1: L
 6:     for s = stage : (log₂N_sub) + 1
 7:       for p_s = 1: 2^(s-1)
 8:         if func(s) = 0 then
 9:           LLR(w) ← f(LLR(a), LLR(b))
10:         else
11:           LLR(w) ← g(LLR(a), LLR(b))
12:         endif
13:       end for
14:     end for
15:     PathMetricUpdate
16:   end for
17:   for s = log₂N_sub : 1
18:     if 𝒟 (j) = 1
19:     else
20:       repeat PathMetricUpdate
21:     end if
22:   end for
23:   if i ∈ 𝒥^c
24:     û_i ← u_i
25:   else
26:     if LLR(w)>0
27:       then set û_i to 0
28:     else
29:       set û_i to 1
30:     end if
31:   end if
32: end for
```

Referring to Table 5, in binary expressions of indexes of all information bits (u), a check node operation may be performed with respect to an index corresponding to 0, and a variable node operation may be performed with respect to an index corresponding to 1. For example, referring to the $9^{th}$ line of the algorithm of Table 5, a check node operation expressed by an f function may be performed with respect to LLR values regarding codeword bits a and b. In addition, referring to the $11^{th}$ line of the algorithm of Table 5, a variable node operation expressed by a g function may be performed with respect to the LLR values regarding the codeword bits a and b. In various embodiments, the SC list decoding technique is similar to the SC decoding technique, but it may add an index expressed by a path matric and may manage information regarding L number of paths having the highest probability. That is, in the SC decoding technique, the reception end may directly determine 0 or 1 when decoding source bits, but in the SC list decoding technique, the reception end may maintain L number of paths having the highest probability and may decode source bits of the best path passing through a cyclic redundancy check (CRC) from among the remaining paths to the final stage. Therefore, when it is time to process an inactivation sub-block while the reception end is continuously updating the path metric, the reception end may directly determine source bits as 0 or 1 by using a path matric at a corresponding stage, and, when it is time to process an activation sub-block, the reception end may update the path metric up to the final stage and then may perform final decoding. For example, on the $15^{th}$ line of the algorithm of Table 5, the reception end may update a path metric value regarding the L number of best paths. In addition, on the $17^{th}$ line to $20^{th}$ line, when an element of an inactivation sub-block index set is 1, that is, when there is an inactivation sub-block, the reception end may not perform path metric updating anymore and may determine to decode. In this case, the decoding determining process is the same as the process described in the $21^{st}$ line to the $29^{th}$ line of Table 3. On the other hand, on the $21^{st}$ line, when there is an activated sub-block, the reception end may repeat path metric updating.

A process of encoding and decoding when the SC-list decoding technique is performed will be described below by way of an example. According to an embodiment, if a code length N is 8, a size of a sub-block ($N_{sub}$) is 2, and a code rate (R) is 0.5, and an index sequence of a polar code is (0, 1, 2, 4, 3, 5, 6, 7) and a set of an information bit index is {3, 5, 6, 7}, the index sequence of the polar code expressed by a binary on-off vector may be (0, 0, 0, 1, 0, 1, 1, 1). In an embodiment, since the size of the sub-block is 2, an index set of a sub-block may be defined like {0, 1, 2, 3}. In this case, a binary on-off set D expressing inactivation/activation may be defined. For example, since the index j of the sub-block is an integer satisfying 0≤j≤3, and indexes of source bits included in the first sub-block are all included in a complementary set (IC) of information bit sets, that is, indicate frozen bits, D(0)=1. In the same way, the transmission end may identify that D(1)=0, D(2)=0, D(3)=1, based on information of source bits included in the $2^{nd}$, $3^{rd}$, $4^{th}$ sub-blocks. In this case, the transmission end may inactivate the first and fourth sub-blocks. In addition, an existing generator matrix may be modified and may be multiplied by a source vector when encoding is performed. In decoding, the reception end may use the index sequence of the polar code (0, 1, 2, 4, 3, 5, 6, 7), and information on an on-ff set D={1,0,0,1} regarding a sub-block to be inactivated. In an embodiment, if the code length is 8, a check node operation or a variable node operation may be performed three times in total to update an LLR value corresponding to each source bit. In this case, when source bits included in an inactivation sub-block are decoded, a check node operation or a variable node operation may be performed only $$\log_2\left(\frac{N}{N_{sub}}\right) = \log_2(4) = 2$$

times, and a source bit value may be determined. On the other hand, in the case of an activated sub-block, that is, the second or third sub-block satisfying D(j)=0, all node operations (for example, 3 times) may be performed normally and a source bit value may be determined. As described above, the transmission end and the reception end may identify an inactivation sub-block, and accordingly, may perform encoding or decoding. Hereinafter, methods for determining a sub-block to be inactivated will be described with reference to FIGS. 11 to 18B.

Figure 11:
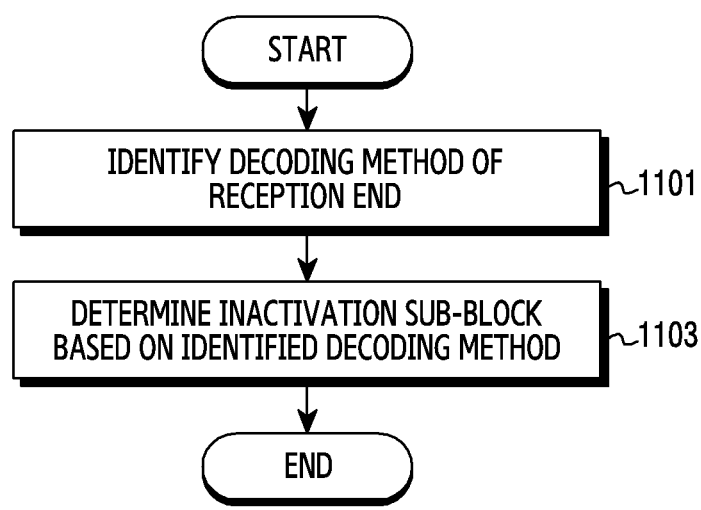
FIG. 11 is a flowchart of a transmission end which determines an inactivation sub-block in a wireless communication system according to various embodiments of the disclosure.

In various embodiments of the disclosure, when a size of a sub-block is determined, source bits in such a sub-block may be formed only of frozen bits, may be formed only of information bit, or may be formed of frozen bits and information bits all together. In various embodiments, a transmission end may inactivate all sub-blocks which are formed only of frozen bits, regardless of the number of sub-blocks or a decoding method. However, in the case of a sub-block formed only of information bits, a decoding method or reliability of the sub-block should be considered when the sub-block is inactivated. FIG. 11 which will be described below illustrates a method for determining an inactivation sub-block at a transmission end.

FIG. 11 is a flowchart of a transmission end which determines an inactivation sub-block in a wireless communication system according to various embodiments of the disclosure. FIG. 11 illustrates an operating method of the transmission end 110 of FIG. 1.

Referring to FIG. 11, at step 1101, the transmission end identifies a decoding method of a reception end. For example, the transmission end may identify whether a decoding method of the reception end is an SC decoding technique, a CRC-aided SCL (CA-SCL) decoding technique, or a puncturing-applied CA-SCL decoding technique. In an embodiment, the reception end may transmit information regarding the decoding technique of the reception end to the transmission end beforehand. In another embodiment, the decoding technique of the reception end may be already determined, and the transmission end may identify the already determined decoding method of the reception end.

At step 1103, the transmission end determines an inactivation sub-block based on the identified decoding method. For example, in the case of the SC decoding technique, the transmission end may inactivate a sub-block formed only of frozen bits, and a sub-block formed only of information bits. In the case of the CA-SCL decoding technique, the transmission end may determine an inactivation sub-block by considering a CRC-aided effect. In the case of the puncturing-applied CA-SCL decoding technique, the transmission end may determine an inactivation sub-block by distinguishing between a capacity-0 puncturing technique and a capacity-1 puncturing technique. In other embodiments, the transmittance end may determine an inactivation sub-block without distinguishing between the capacity-0 puncturing technique and the capacity-1 puncturing technique. In various embodiments, an inactivation sub-block may be already determined according to a decoding method of the reception end, and may be stored in a storage of the transmission end.

Figure 12:
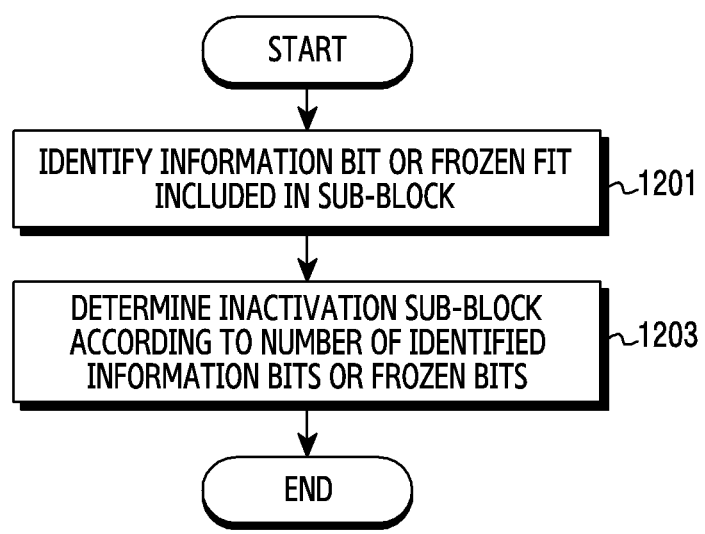
FIG. 12 is a flowchart of a transmission end which determines an inactivation sub-block when successive cancellation (SC) decoding is performed in a wireless communication system according to various embodiments of the disclosure.

FIG. 12 is a flowchart of a transmission end which determines an inactivation sub-block when SC decoding is performed in a wireless communication system according to various embodiments of the disclosure. FIG. 12 illustrates an operating method of the transmission end 110 of FIG. 1.

Referring to FIG. 12, at step 1201, the transmission end identifies an information bit or a frozen bit included in a sub-block. For example, the transmission end may identify whether only information bits are included in a sub-block, only frozen bits are included in a sub-block, or information bits and frozen bits are included in a sub-block all together. FIG. 13A illustrates an example of determining an inactivation sub-block when SC decoding is performed. Referring to FIG. 13A, if a code length is 64, a size of a sub-block is 4, and a code rate is 0.5, 64 source bits $u_0$ to $u_{63}$ 1300 may be divided into groups of 4 and may correspond to sub-blocks $b_0$ to $b_{15}$ 1312. That is, the source bits $u_0$ to $u_{63}$ 1300 may be included in the sub-blocks $b_0$ to $b_{15}$ having the size of 4. For example, the source bits $u_0$ to $u_3$ 1302 may correspond to the sub-block $b_0$ 1312-1. In various embodiments, when the transmission end knows a polar code sequence, the transmission end may identify whether bits of each sub-block are information bits or frozen bits, with respect to the determined code length and the sub-block. For example, the transmission end may identify the number of information bits 1314 and the number of frozen bits 1316 included in each sub-block 1312, which are shown in table 1310. For example, the transmission end may identify that the number of information bits 1314 included in the sub-block $b_0$ is 0, and the number of frozen bits 1316 included in the sub-block $b_0$ is 4.

At step 1203, the transmission end determines an inactivation sub-block according to the identified number of information bits or frozen bits. For example, referring to FIG. 13A, the transmission end may sort the sub-blocks according to an ascending order of the number of information bits 1314, which is shown in table 1320. The transmission end may inactivate sub-blocks $b_0$, $b_1$, $b_2$, $b_4$, $b_8$ 1322 that are formed only of frozen bits, and may also inactivate sub-blocks $b_7$, $b_{11}$, $b_{13}$, $b_{14}$, $b_{15}$ 1326 that are formed only of information bits. On the other hand, sub-blocks $b_3$, $b_5$, $b_6$, $b_9$, $b_{10}$, $b_{12}$ 1324 including information bits and frozen bits all together may not be inactivated. That is, they may be activated.

In other embodiments, FIG. 13B illustrates an example of determining an inactivation sub-block when SC decoding is performed. The transmission end may identify indexes of source bits 1330, sub-block indexes 1332, states of source bits 1334, degrees of source bits 1336, degrees of sub-blocks 1338, and states of sub-block inactivation 1340. In various embodiments, if the state of the source bit 1334 indicates a frozen bit, the state is expressed by F, and, if the state of the source bit indicates an information bit, the state is expressed by I. In various embodiments, the degree of the source bit 1336 may refer to the number of 1s in a row corresponding to the index 1330 of a corresponding source bit in a generator matrix. For example, if a code length is 16 and a size of a sub-block is 2, a generator matrix $G_{16}$ may be defined by $$G_{16} = F_2^{\otimes 4}\left(F_2 = \begin{pmatrix} 1 & 0 \\ 1 & 1 \end{pmatrix}\right),$$

and may have a size of 16×16. In this case, if the index 1330 of the source bit is 0, the number of is in the first row of the generator matrix $G_{16}$ may correspond to the degree of the source bit 1336. For example, the degree of the 0-th source bit is 1. In various embodiments, the degree may be expressed by a row weight sum. In various embodiments, the degree of the sub-block may refer to a sum of degrees corresponding to the source bits included in the corresponding sub-block. In various embodiments, the degree of the sub-block may be referred to as a weight of the sub-block. For example, in FIG. 13B, since the sub-block having the sub-block index 1332 of 0 includes source bits the degrees 1336 of which are 1 and 2, the degree 1338 of the $0^{th}$ sub-block is 3 which is a sum of 1 and 2. In various embodiments, if the size of the sub-block is 2, the transmission end may identify that the $0^{th}$, $1^{st}$, $2^{nd}$ indexes of the sub-block index 1332 include only frozen bits, and the $5^{th}$, $6^{th}$, $7^{th}$ indexes include only information bits. In this case, with respect to the index set {0, 1, 2} of the sub-blocks including only the frozen bits, the transmission end may inactivate the corresponding sub-blocks. In addition, with respect to the index set {5, 6, 7} of the sub-blocks including only the information bits, the transmission end may inactivate the corresponding sub-blocks. In various embodiments, when the decoding method of the reception end is SC decoding, a corresponding inactivation sub-block may be already determined and may be stored in the storage of the transmission end.

As described above, the transmission end may inactivate sub-blocks formed only of information bits, and sub-blocks formed only of frozen bits, and in this case, performance degradation may not occur.

Figure 14:
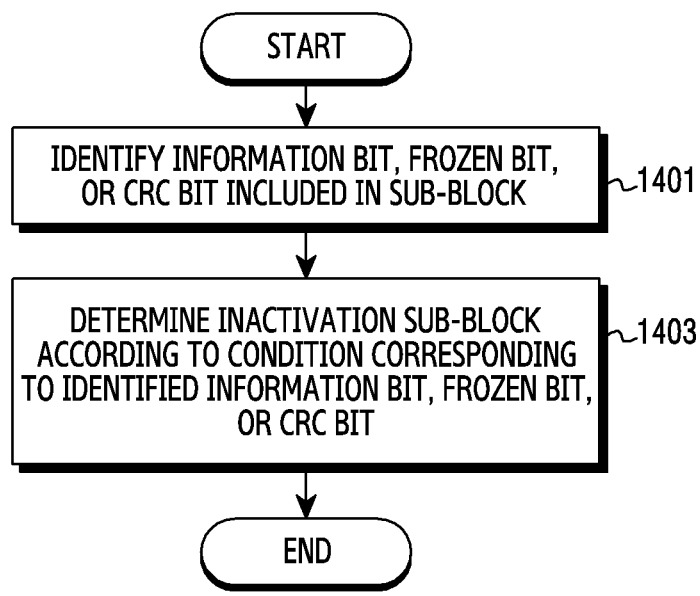
FIG. 14 is a flowchart of a transmission end which determines an inactivation sub-block when cyclic redundancy check (CRC)-aided SCL (CA-SCL) decoding is performed in a wireless communication system according to various embodiments of the disclosure.

However, in the case of the CRC-aided SCL decoding technique, bits may not be independent from one another, and sub-blocks may be dependent on one another when decoding is performed. Therefore, if the same criterion as in the SC decoding technique is applied, performance degradation may occur. Accordingly, when list decoding or CRC-aided list decoding is performed, sub-blocks may be inactivated according to an additional criterion. FIG. 14 illustrates a method for determining an inactivation sub-block when CA-SCL decoding is performed.

FIG. 14 is a flowchart of a transmission end which determines an inactivation sub-block when CA-SCL decoding is performed in a wireless communication system according to various embodiments of the disclosure. FIG. 14 illustrates an operating method of the transmission end 110 of FIG. 1.

Referring to FIG. 14, at step 1401, the transmission end may identify an information bit, a frozen bit, or a CRC bit included in a sub-block. For example, the transmission end may identify whether an information bit, a frozen bit or a CRC bit is included in a corresponding sub-block with respect to the sub-block of a predetermined size.

Figure 15:
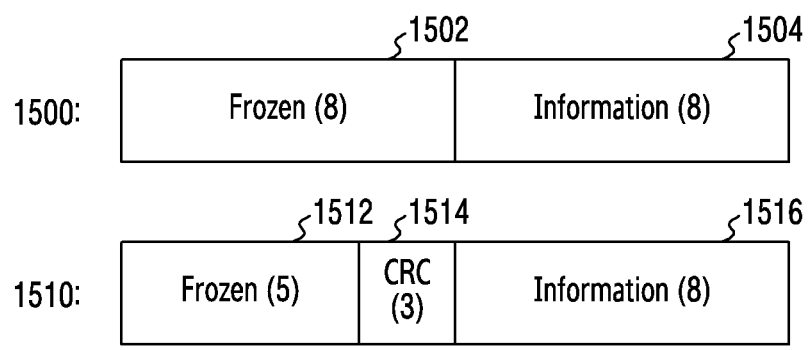
FIG. 15 is a view illustrating an example of a bit sequence of a CRC-aided polar code in a wireless communication system according to various embodiments of the disclosure.
Figure 16B:
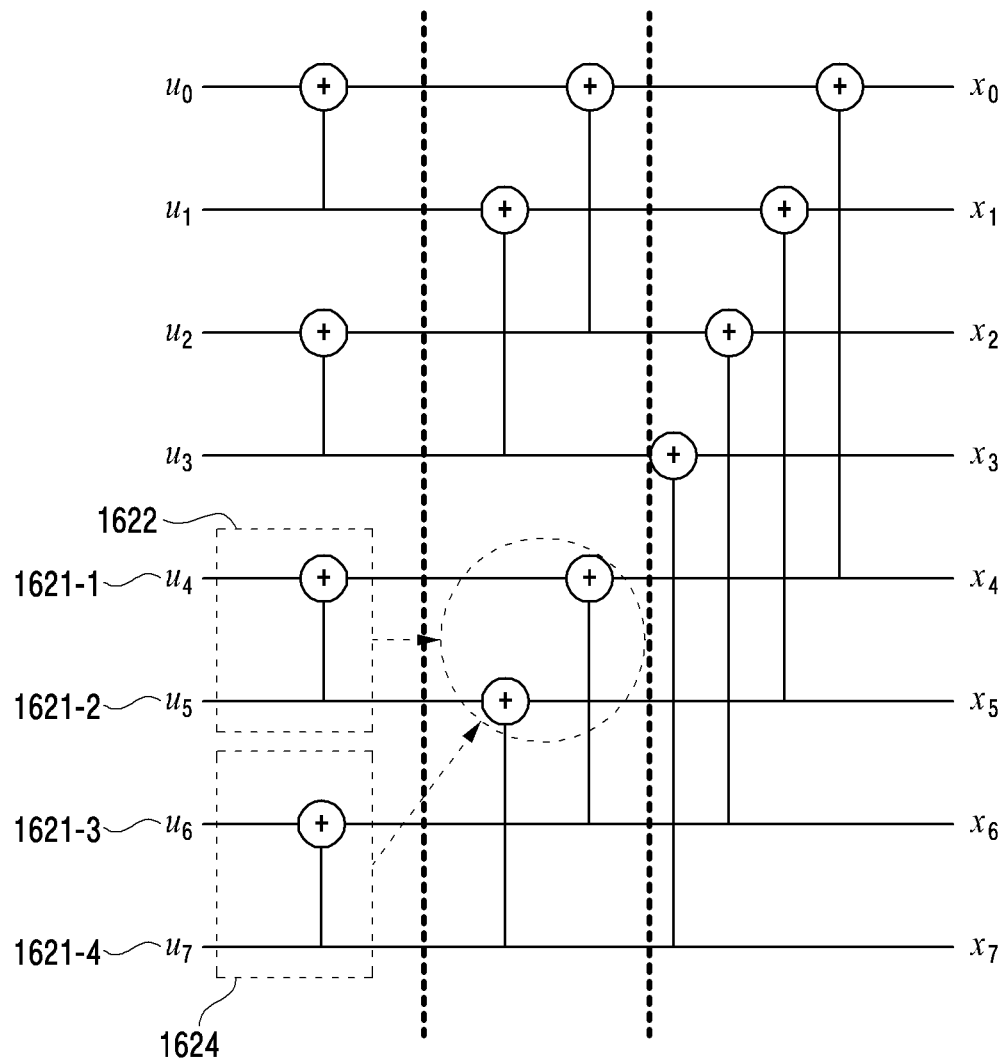
FIG. 16B is a view illustrating an example of a sub-block which cannot be inactivated when CA-SCL decoding is performed in a wireless communication system according to various embodiments of the disclosure.

At step 1403, the transmission end may determine an inactivation sub-block according to a condition corresponding to the identified information bit, frozen bit, or CRC bit. For example, the transmission end may inactivate a sub-block formed only of frozen bits, and, with respect to a sub-block formed only of information bits, may consider a degree of the sub-block. In addition, when a sub-block formed of information bits and frozen bits is included in a block that has a size two times larger than a current sub-block, the transmission end may not inactivate the current sub-block. In various embodiments, when the decoding method of the transmission end is CA-SCL decoding, a corresponding inactivation sub-block may be already determined, and may be stored in the storage of the transmission end. FIGS. 15 to 16B illustrate an example of a bit sequence of a polar code when CRC is aided, and a method for determining an inactivation sub-block.

FIG. 15 illustrates an example of a bit sequence of a CRC-aided polar code in a wireless communication system according to various embodiments of the disclosure.

Referring to FIG. 15, if a code length N is 16 and a code rate R is 0.5, a bit sequence 1500 that is not aided by CRC may include 8 frozen bits 1502 and 8 information bits 1504. When 3 CRC bits 1514 are aided and a bit sequence is arranged in order from a high bit error rate to a low bit error rate, a bit sequence 1510 is generated. In this case, the bit sequence 1510 may include 5 frozen bits 1512, 3 CRC bits 1514, and 8 information bits 1516. When the 3 CRC bits are aided, 3 bits having the lowest bit error rate from among the 8 frozen bits, that is, the 3 bits on the rightmost side of the frozen bits, may operate like information bits. In an embodiment, the bit sequence may be a polarization weight (PW) sequence in the code length of 16. In this case, the order of the bit sequence may be (0, 1, 2, 4, 8, 3, 5, 6, 9, 10, 12, 7, 11, 13, 14, 15). In addition, if the code rate is 0.5, the 8 bits on the head, that is, (0, 1, 2, 4, 8, 3, 5, 6), are frozen bits, and the last 3 bits, that is, (3, 5, 6), may be indexes of bits operating like information bits when CRC is aided.

FIG. 16A illustrates an example of determining an inactivation sub-block when CA-SCL decoding is performed in a wireless communication system according to various embodiments of the disclosure.

Figure 17:
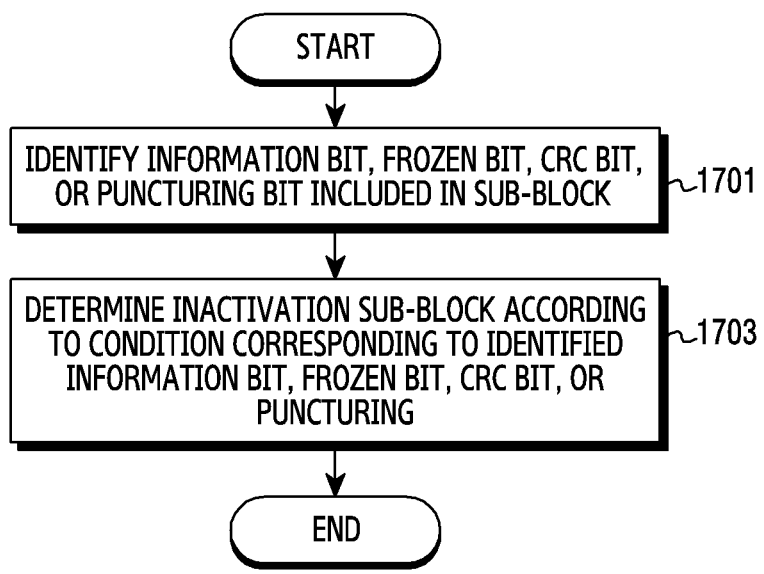
FIG. 17 is a flowchart of a transmission end which determines an inactivation sub-block when CA-SCL decoding to which a puncturing technique is applied is performed in a wireless communication system according to various embodiments of the disclosure.

Referring to FIG. 16A, examples of indexes of source bits 1602, sub-block indexes 1604, states of source bits 1606, degrees of source bits 1608, degrees of sub-blocks 1610, and states of sub-block inactivation 1612 if a code length (N) is 16, a code rate (R) is 0.5, and a size of a sub-block ($N_{sub}$) is 2 are illustrated. In various embodiments, if the state of the source bit 1606 indicates a frozen bit, the state may be expressed by F, if the state of the source bit indicates an information bit, the state may be expressed by I, and if the state of the source bit indicates a CRC bit, the state may be expressed by CRC. In various embodiments, if the index of the source bit 1602 is 3, 5, and 6, the transmission end may identify that the states of the corresponding source bits 1606 are CRC bits which operate like information bits, not like frozen bits. Since the sub-block having the sub-block index 1604 of 0 includes only frozen bits, the transmission end may inactivate the corresponding sub-block. However, since sub-blocks having the sub-block indexes 1604 of 1 and 2 include not only frozen bits but also CRC bits, the transmission end may not inactivate these sub-blocks. In various embodiments, in the case of a sub-block formed only of information bits, the transmission end may consider the degree of the sub-block, that is, a row weight sum. In various embodiments, the state of the inactivation 1612 of the sub-block formed only of information bits may be determined based on the degree of the sub-block. In this case, specific sub-block inactivation conditions are as follows. The first condition is that the transmission end inactivates the sub-block having the highest degree 1610 of the sub-block, first. The second condition is that, if the degrees 1610 of various sub-blocks are the same, the transmission end inactivates the sub-blocks in sequence from the sub-block having the highest sub-block index. The third condition is that, if a sub-block including information bits and frozen bits all together is included in a block having a size two times larger than a current sub-block, the transmission end does not inactivate the current sub-block. The fourth condition is that, when a sub-block satisfying the third condition is identified, the transmission end does not proceed with sub-block inactivation anymore, and stops inactivating the sub-block. For example, since the sub-block having the sub-block index 1604 of 7 has the highest degree 1610 of the sub-block, 24, the transmission end may inactivate the sub-block having the sub-block index 1604 of 7. An arrow 1614 of FIG. 16A may indicate that sub-block inactivation is determined in order from the highest degree 1610 of the sub-block. In addition, sub-blocks having the sub-block indexes 1604 of 5 and 6 have the same degree of the sub block, 12, but the $6^{th}$ sub-block having the higher sub-block index 1604 may be inactivated first. The sub-block having the sub-block index 1604 of 5 is formed only of information bits according to the state 1606 of the source bit, and the degree thereof is 12, but the fourth sub-block formed of frozen bits and information bits is included in a block having a size (for example, 4) two time larger than the size (for example, 2) of the current $5^{th}$ sub-block. Therefore, the transmission end may not inactivate the $5^{th}$ sub-block and may stop inactivating the sub-block. A specific example of the above-described third condition is illustrated in FIG. 16B. Referring to FIG. 16B, a source bit $u_4$ 1621-1 may be a frozen bit, a source bit $u_5$ 1621-2 may be an information bit, a source bit $u_6$ 1621-3 may be an information bit, a source bit $u_7$ 1621-4 may be an information bit. In this case, a sub-block 1624 includes only information bits, but a sub-block 1622 including a frozen bit and an information bit is included in a block having a size (for example, 4) two times larger than a size (for example, 2) of the sub-block 1624. Therefore, the transmission end may not inactivate the sub-block 1624. In various embodiments, the reason why the transmission end does not inactivate the sub-block 1624 is that, when stages proceed from a source bit end to a code bit end, that is, when a depth is deeper, a node operation may be performed with respect to the frozen bit 1621-1 included in the sub-block 1622 and the information bit 1621-3 included in the sub-block 1624 at the next stage of the stage including the sub-block 1622 and the sub-block 1624. That is, if the node operation for the information bit and the frozen bit can be performed even at the next stage, the transmission end may not inactivate the sub-block including the corresponding information bit or frozen bit. According to the above-described criteria, an inactivation sub-block may be determined when CA-SCL decoding is performed. FIGS. 17 to 18B, which will be described below, illustrate a method for determining an inactivation sub-block when puncturing-applied CA-SCL decoding is performed.

FIG. 17 is a flowchart of a transmission end which determines an inactivation sub-block when puncturing-applied CA-SCL decoding is performed in a wireless communication system according to various embodiments of the disclosure. FIG. 17 illustrates an operating method of the transmission end 110 of FIG. 1.

Referring to FIG. 17, at step S1701, the transmission end may identify an information bit, a frozen bit, a CRC bit, or puncturing included in a sub-block. For example, with respect to a sub-block of a predetermined size, the transmission end may identify whether an information bit, a frozen bit, a CRC bit, or puncturing is included in the corresponding sub-block.

At step 1703, the transmission end may determine an inactivation sub-block according to a condition corresponding to the identified information bit, frozen bit, CRC bit, or puncturing. For example, the transmission end may inactivate a sub-block formed only of frozen bits or a sub-block formed only of puncturing bits. In addition, the transmission end may inactivate a sub-block formed of frozen bits and puncturing bits. In the case of a sub-block formed only of information bits, the transmission end may determine an inactivation sub-block by considering a degree of the sub-block as in CA-SCL decoding. In various embodiments, when a decoding method of the reception end is puncturing-applied CA-SCL decoding, a corresponding inactivation sub-block may already be determined and may be stored in the storage of the transmission end.

In various embodiments, the puncturing technique may be classified into a capacity-0 puncturing technique and a capacity-1 puncturing technique. For example, the capacity-0 puncturing technique is a technique by which the transmission end does not transmit some codeword bits to the reception end after polar encoding, and may be referred to as unknown bit puncturing. The capacity-1 puncturing technique is a technique by which the transmission end shortens some source bits of the total source bits to 0, and sets the same number of codeword bits related to the shortened source bits to a fixed value, and then does not transmit the source bits to the reception end, and may be referred to as known bit puncturing. FIGS. 18A and 18B, which will be described below, illustrate an example of determining an inactivation sub-block when an unknown bit is punctured or a known bit is punctured in the puncturing techniques.

FIG. 18A illustrates an example of determining an inactivation sub-block when an unknown bit is punctured in a wireless communication system according to various embodiments of the disclosure.

Referring to FIG. 18A, examples of indexes of source bits 1802, sub-block indexes 1804, states of source bits 1806, degrees of source bits 1808, degrees of sub-blocks 1810, and states of inactivation of sub-blocks 1812 if a code length (N) is 16, a size of a sub-block ($N_{sub}$) is 2, and the number of CRC bits (nCRC) is 2 are illustrated. In various embodiments, if the state 1806 of the source bit indicates a frozen bit, the state may be expressed by F, if the state 1806 indicates an information bit, the state may be expressed by I, if the state 1806 indicates a CRC bit, the state may be expressed by CRC, and, if the state 1806 indicates a puncturing bit, the state may be expressed by Punc. In various embodiments, in the case of capacity-0 puncturing to which bit-reversal is not applied, the source bits may be punctured in order from the lowest index to the highest index. For example, source bits having the indexes 1802 of 0, 1, 2 may be punctured first. In this case, the transmission end may inactivate all of the sub-block formed only of puncturing bits, the sub-block formed of puncturing bits and frozen bits, or the sub-block formed only of frozen bits. For example, if the sub-block index 1804 is 0, the states 1806 of the source bits included in the corresponding sub-block all indicate puncturing bits, and accordingly, the transmission end may inactivate the sub-block having the index of 0. In addition, if the sub-block index 1804 is 1, the states 1806 of the source bits included in the corresponding sub-block indicate puncturing bits and frozen bits, and accordingly, the transmission end may inactivate the sub-block having the index of 1. In addition, if the sub-block index 1804 is 2, the states 1806 of the source bits included in the corresponding sub-block all indicate frozen bits, and accordingly, the transmission end may inactivate the sub-block having the index of 2. In various embodiments, in the case of a sub-block formed only of information bits, the same inactivation sub-block determination method as in CA-SCL may be applied. That is, the first condition is that the transmission end inactivates the sub-block having the highest degree 1810 of the sub-block, first. The second condition is that, if the degrees 1810 of various sub-blocks are the same, the transmission end inactivates the sub-blocks in sequence from the sub-block having the highest sub-block index. The third condition is that, if a sub-block including information bits and frozen bits all together is included in a block having a size two times larger than a current sub-block, the transmission end does not inactivate the current sub-block. For example, the transmission end may inactivate the $7^{th}$ sub-block having the highest degree of the sub-block 1810, 24. In addition, since the $5^{th}$ and $6^{th}$ sub-blocks have the same degree 1810, 12, the transmission end may inactivate the $6^{th}$ sub-block having the higher sub-block index 1804. In the case of the $5^{th}$ sub-block, the states 1806 of the source bits included in the $5^{th}$ sub-block indicate CRC bits and information bits. In this case, the CRC bit may operate like an information bit. However, since the $4^{th}$ sub-block including frozen bits and CRC bits is included in a block having a size (for example, 4) two times lager than a size (for example, 2) of the $5^{th}$ sub-block, the transmission end may not inactivate the $5^{th}$ sub-block.

FIG. 18B illustrates an example of determining an inactivation sub-block when capacity-1 puncturing to which bit-reversal is not applied is performed in a wireless communication system according to various embodiments.

Referring to FIG. 18B, examples of indexes of source bits 1822, sub-block indexes 1824, states of source bits 1826, degrees of source bits 1828, degrees of sub-blocks 1830, and states of inactivation of sub-blocks 1832 if a code length (N) is 16, a size of a sub-block ($N_{sub}$) is 2, and the number of CRC bits (nCRC) is 2 are illustrated. In various embodiments, if the state 1826 of the source bit indicates a frozen bit, the state may be expressed by F, if the state 1826 indicates an information bit, the state may be expressed by I, if the state 1826 indicates a CRC bit, the state may be expressed by CRC, and, if the state 1826 indicates a puncturing bit, the state may be expressed by Punc. In various embodiments, in the case of capacity-1 puncturing, the source bits may be punctured in order from the highest index to the lowest index. For example, source bits having the indexes 1822 of 13, 14, 15 may be punctured first. In various embodiments, the transmission end may inactivate a sub-block formed only of frozen bits, first. For example, with respect to the sub-block having the sub-block index 1826 of 0, the states 1826 of source bits included in the corresponding sub-block all indicate frozen bits, and accordingly, the transmission end may inactivate the sub-block having the index of 0. Since sub-blocks having the $1^{st}$ and $2^{nd}$ indexes are formed of frozen bits and CRC bits operating like information bits, the transmission end may not inactivate the $1^{st}$ and $2^{nd}$ sub-blocks. In various embodiments, the transmission end may inactivate a sub-block formed only of puncturing bits. For example, if the sub-block index 1824 is 7, the states 1826 of the source bits included in the corresponding sub-block all indicate puncturing bits, and accordingly, the transmission end may inactivate the sub-block having the index of 7. If the sub-block index 1824 is 6, the states 1826 of the source bits included in the corresponding sub-block indicate information bits and puncturing bits. In various embodiments, the transmission end may not inactivate the sub-block having the index of 6 and including information bits and puncturing bits. In addition, in the case of the sub-block having the index of 5, the sub-block is formed only of information bits, but the sub-block having the index of 5 and including frozen bits and information bits is included in a block having a size (for example, 4) two times larger than a size (for example, 2) of the sub-block having the index of 5, and accordingly, the transmission end may not inactivate the sub-block having the index of 5. Likewise, in the case of the sub-block having the index of 3, the sub-block is formed only of information bits, but the sub-block having the index of 2 and including frozen bits and CRC bits operating like information bits is included in a block having a size (for example, 4) two times larger than a size (for example, 2) of the sub-block having the index of 3, and accordingly, the transmission end may not inactivate the sub-block having the index of 3. Through the above-described criteria, the transmission end may determine an inactivation sub-block when puncturing-applied CA-SCL decoding is performed.

Through the sub-block inactivation according to various embodiments of the disclosure, excellent performance can be guaranteed with low operation complexity in an encoding and decoding process. According to the method described in the disclosure, an existing polar code applied to a $5^{th}$ generation (5G) communication system may be replaced and various scenarios may be supported. For example, FIGS. 19A to 20B illustrate scenarios of sub-block inactivation applied to a transmission end and a reception end.

Figure 19A:
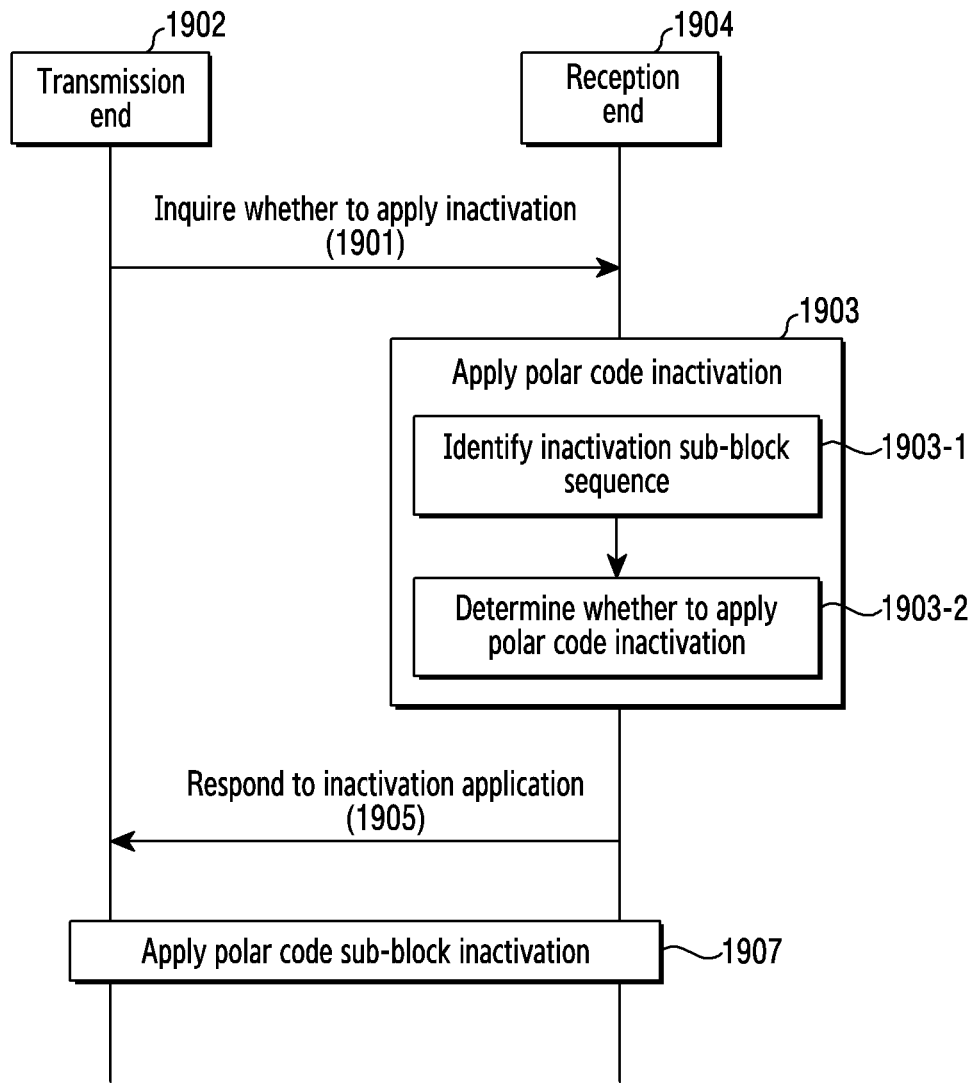
FIG. 19A is a sequence diagram illustrating a sub-block inactivation procedure at a transmission end and a reception end in a wireless communication system according to various embodiments of the disclosure.

FIG. 19A is a sequence diagram illustrating a sub-block inactivation procedure at a transmission end and a reception end in a wireless communication system according to various embodiments of the disclosure. In FIG. 19A, a transmission end 1902 may refer to the transmission end 110 of FIG. 1, and a reception end 1904 may refer to the reception end 120 of FIG. 1. In various embodiments, in the case of an uplink, the transmission end 1902 may refer to a terminal and the reception end 1904 may refer to a base station. In the case of a downlink, the transmission end 1902 may refer to a base station and the reception end 1904 may refer to a terminal. In the case of communication between terminals, the transmission end 1902 may refer to a first terminal and the reception end 1904 may refer to a second terminal.

Referring to FIG. 19A, at step 1901, the transmission end 1902 may inquire of the reception end 1904 whether to apply sub-block inactivation. That is, the transmission end 1902 may transmit a sub-block inactivation application request to the reception end 1904. In an embodiment, the sub-block inactivation application request may include information regarding a sequence of a sub-block to be inactivated. In an embodiment, the information regarding the sub-block to be inactivated may be pre-defined and may be stored in a storage of the transmission end 1902.

At step 1903, the reception end 1904 may apply polar code inactivation. For example, the reception end 1904 may identify a sequence of an inactivation sub-block at step 1903-1. In addition, the reception end 1904 may determine whether to apply polar code inactivation at step 1903-2. That is, the reception end 1904 may determine whether to apply sub-block inactivation.

At step 1905, the reception end 1904 may respond to the application of the inactivation. That is, when the sub-block inactivation application request transmitted at step 1901 includes the information regarding the sequence of the sub-block to be inactivated, the reception end 1904 may transmit, to the transmission end 1902, a response including information regarding whether the sub-block inactivation is applied.

At step 1907, the transmission end 1902 and the reception end 1904 may apply polar code sub-block inactivation. That is, when the inactivation application response transmitted by the reception end 1904 includes information indicating that sub-block inactivation is applied, the transmission end 1902 and the reception end 1904 may use the sub-block inactivation when encoding and decoding.

Figure 19B:
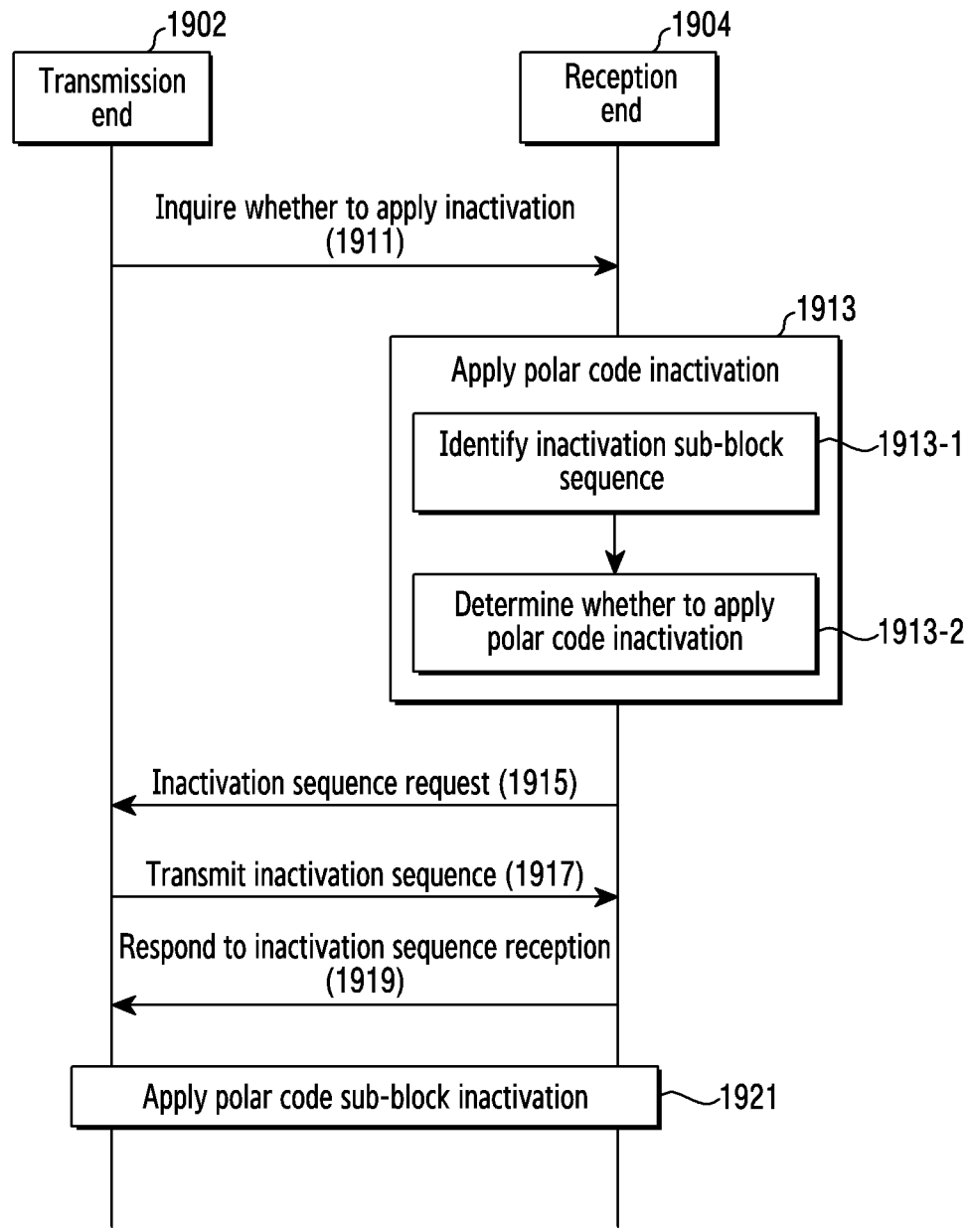
FIG. 19B is a sequence diagram illustrating a sub-block inactivation procedure at a transmission end and a reception end in a wireless communication system according to various embodiments of the disclosure.

FIG. 19B is a sequence diagram illustrating a sub-block inactivation procedure at a transmission end and a reception end in a wireless communication system according to various embodiments of the disclosure. In FIG. 19B, the transmission end 1902 may refer to the transmission end 110 of FIG. 1, and the reception end 1904 may refer to the reception end 120 of FIG. 1. In various embodiments, in the case of an uplink, the transmission end 1902 may refer to a terminal and the reception end 1904 may refer to a base station. In the case of a downlink, the transmission end 1902 may refer to a base station and the reception end 1904 may refer to a terminal. In the case of communication between terminals, the transmission end 1902 may refer to a first terminal and the reception end 1902 may refer to a second terminal.

Referring to FIG. 19B, at step 1911, the transmission end 1902 may inquire of the reception end 1904 whether to apply sub-block inactivation. That is, the transmission end 1902 may transmit a sub-block inactivation application request to the reception end 1904. In an embodiment, the sub-block inactivation application request may not include information regarding an inactivation sequence. In an embodiment, information regarding a sub-block to be inactivated may be pre-defined, and may be stored in a storage of the transmission end 1902.

At step 1913, the reception end 1904 may apply polar code inactivation. For example, the reception end 1904 may identify a sequence of an inactivation sub-block at step 1913-1. In addition, the reception end 1904 may determine whether to apply the polar code inactivation at step 1913-2. That is, the reception end 1904 may determine whether to apply the sub-block inactivation.

At step 1915, the reception end 1904 may request an inactivation sequence. That is, since the reception end 1904 determines to apply the polar code inactivation at step 1913, but the sub-block inactivation request transmitted at step 1911 does not include information regarding a sequence of a sub-block to be inactivated, the reception end 1904 may transmit a sequence request regarding the sub-block to be inactivated to the transmission end 1902.

At step 1917, the transmission end 1902 may transmit an inactivation sequence. That is, the transmission end 1902 may transmit a sequence including an index of a sub-block to be inactivated to the reception end 1904 in response to the inactivation sequence request.

At step 1919, the reception end 1904 may respond to the reception of the inactivation sequence. That is, the reception end 1904 may receive the sequence including the index of the sub-block to be inactivated from the transmission end 1902, and may transmit a response thereto to the transmission end 1902.

Figure 20A:
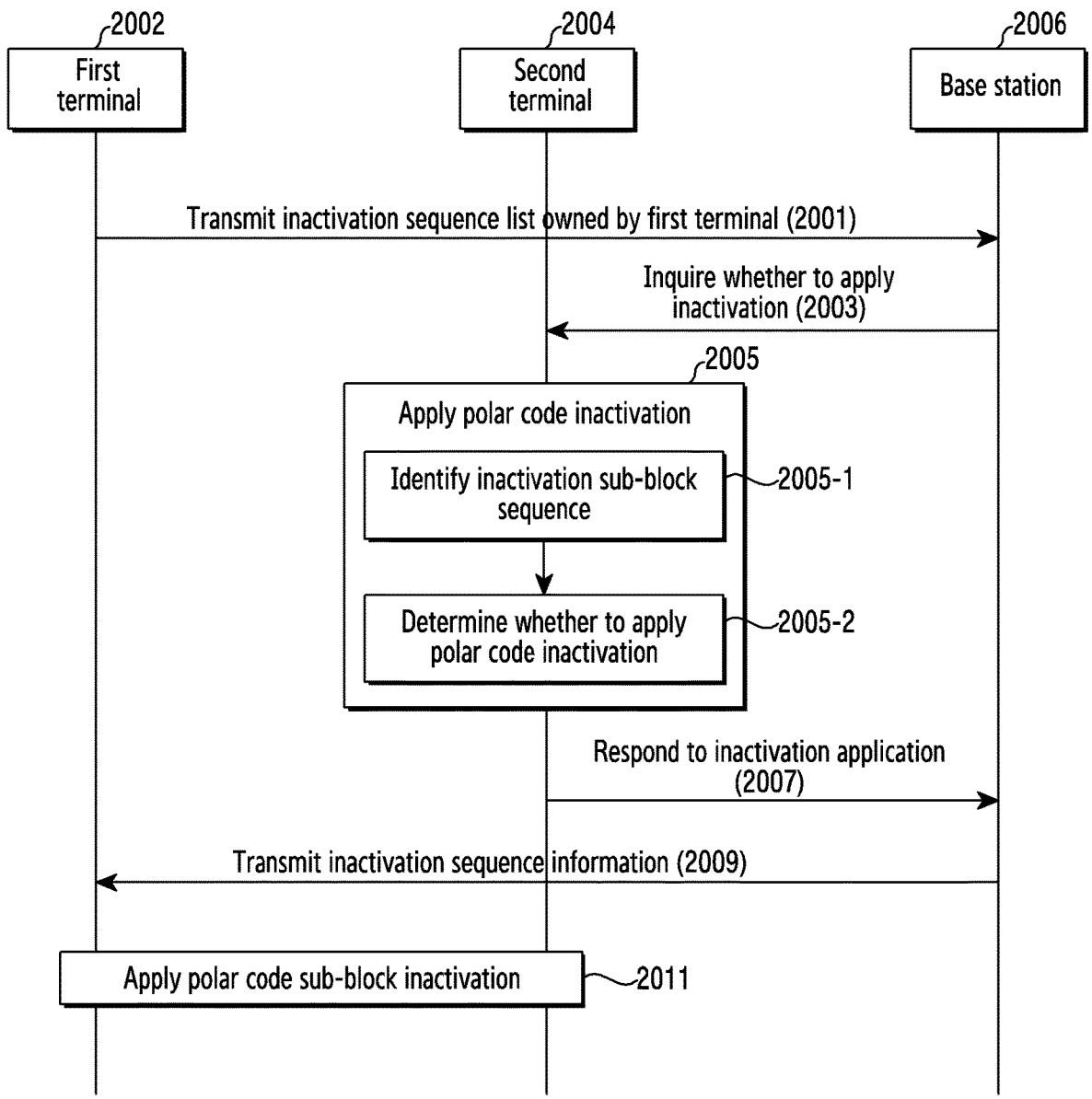
FIG. 20A is a sequence diagram illustrating a sub-block inactivation procedure at a transmission end, a reception end, and a base station in a wireless communication system according to various embodiments of the disclosure.
Figure 20B:
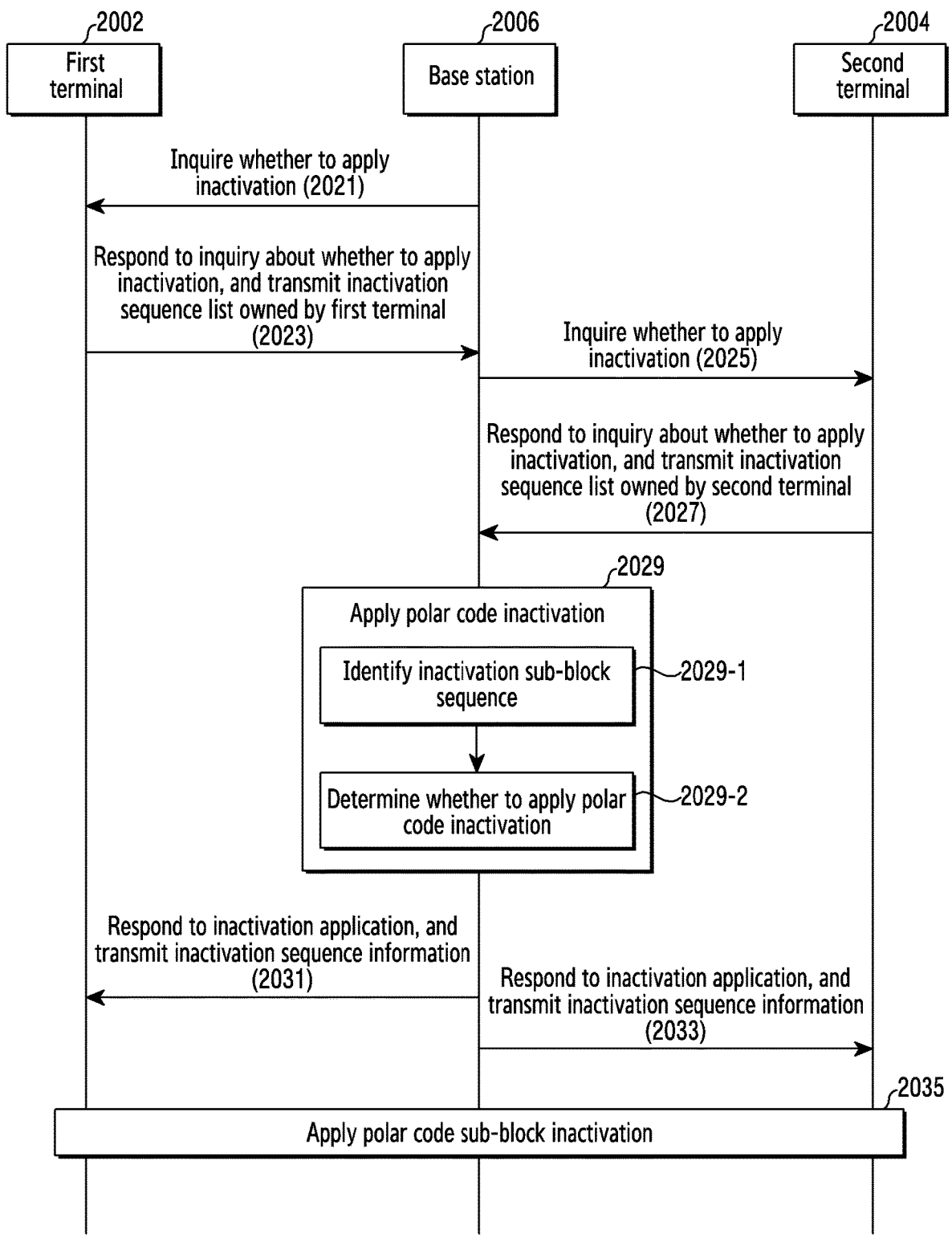
FIG. 20B is a sequence diagram illustrating a sub-block inactivation procedure at a transmission end, a reception end, and a base station in a wireless communication system according to various embodiments of the disclosure.

At step 1921, the transmission end 1902 and the reception end 1904 may apply the polar code sub-block inactivation. The transmission end 1902 and the reception end 1904 may use the sub-block inactivation when encoding and decoding. FIGS. 20A and 20B illustrate an example of applying polar code inactivation when encoding and decoding are performed through signaling procedures of terminals and a base station in the case of communications between terminals.

FIG. 20A is a sequence diagram illustrating a sub-block inactivation procedure at a transmission end, a reception end and a base station in a wireless communication system according to various embodiments of the disclosure. In FIG. 20A, a first terminal 2002 may refer to the transmission end 110 of FIG. 1, and a second terminal 2004 may refer to the reception end 120 of FIG. 1.

Referring to FIG. 20A, at step 2001, the first terminal 2002 may transmit its own inactivation sequence list. That is, the first terminal 2002 may transmit a sequence including an index of an inactivation sub-block to a base station 2006. For example, the sequence including the index of the inactivation sub-block may be expressed by a set D. In various embodiments, the first terminal 2002 may determine a sub-block to be inactivated by identifying a frozen bit, an information bit, or a CRC bit or a puncturing bit included in the sub-block. In an embodiment, information of the sub-block to be inactivated may be pre-defined and may be stored in a storage of the first terminal 2002.

At step 2003, the base station 2006 may inquire whether to apply inactivation. That is, the base station 2006 may transmit a message inquiring of the second terminal 2004 whether to apply sub-block inactivation.

At step 2005, the second terminal 2004 may apply polar code inactivation. For example, the second terminal 2004 may identify the inactivation sub-block sequence at step 2005-1. In an embodiment, the inactivation sub-block sequence may be included in the inactivation application inquiring message transmitted by the base station 2006. At step 2005-2, the second terminal 2004 may determine whether to apply polar code inactivation. That is, the second terminal 2004 may determine whether to apply sub-block inactivation to the identified inactivation sub-block.

At step 2007, the second terminal 2004 may transmit an inactivation application response to the base station 2006. That is, the second terminal 2004 may transmit a result of determining whether to apply inactivation at step 2005-2 to the base station 2006.

At step 2009, the base station 2006 may transmit inactivation sequence information to the transmission end 2009. That is, the base station 2006 may transmit, to the first terminal 2002, a response indicating that the corresponding sub-block is used for polar code sub-block inactivation with the terminal 2 2004 with respect to the sequence of the inactivation sub-blocks transmitted by the first terminal 2002 at step 2001.

At step 2011, the first terminal 2002 and the second terminal 2004 may apply the polar code inactivation. That is, the first terminal 2002 and the second terminal 2004 may use the sub-block inactivation when encoding and decoding.

FIG. 20B is a sequence diagram illustrating a sub-block inactivation procedure at a transmission end, a reception end, and a base station in a wireless communication system according to various embodiments of the disclosure. In FIG. 20B, the first terminal 2002 may refer to the transmission end 110 of FIG. 1, and the second terminal 2004 may refer to the reception end 120 of FIG. 1.

Referring to FIG. 20B, at step 2021, the base station 2006 may inquire of the first terminal 2002 whether to apply inactivation. That is, the base station 2006 may transmit a message inquiring whether to apply sub-block inactivation to the first terminal 2002.

At step 2023, the first terminal 2002 may transmit a response to the inquiry about whether inactivation is applied, and its own inactivation sequence list. That is, the first terminal 2002 may transmit a response to the inquiry about whether sub-block inactivation is applied to the base station 2006, and may transmit a sequence including an index of an inactivation sub-block. In an embodiment, the sequence including the index of the inactivation sub-block which is usable at the first terminal 2002 may be pre-defined and may be stored in a storage of the terminal 1 2002. In another embodiment, when the first terminal 2002 does not have information regarding the sequence including the index of the inactivation sub-block, the first terminal 2002 may transmit only the response to the inquiry about whether inactivation is applied to the base station 2006.

At step 2025, the base station 2006 may inquire of the second terminal 2004 whether to apply inactivation. That is, the base station 2006 may transmit a message inquiring whether to apply sub-block inactivation to the second terminal 2004.

At step 2027, the second terminal 2004 may transmit a response to the inquiry about whether inactivation is applied, and its own inactivation sequence list. That is, the second terminal 2004 may transmit a response to the inquiry about whether sub-block inactivation is applied to the base station 2006, and may transmit a sequence including an index of an inactivation sub-block. In an embodiment, the sequence including the index of the inactivation sub-block which is usable at the second terminal 2004 may be pre-defined, and may be stored in a storage of the second terminal 2004. In another embodiment, when the second terminal 2004 does not have information regarding the sequence including the index of the inactivation sub-block, the second terminal 2004 may transmit only the response to the inquiry about whether inactivation is applied to the base station 2006.

At step 2029, the base station 2006 may apply polar code inactivation. For example, the base station 2006 may identify the inactivation sub-block sequence at step 2029-1. In an embodiment, the inactivation sub-block sequence may be received from the first terminal 2002 at step 2023, or may be received from the second terminal 2004 at step 2027. That is, the base station 2006 may identify the index of the inactivation sub-block usable at the first terminal 2002, and the index of the inactivation sub-block usable at the second terminal 2004. In another embodiment, when the base station 2006 does not receive the inactivation sub-block sequence from the first terminal 2002 and the second terminal 2004, the base station 2006 may directly determine an inactivation sub-block, or may identify an index of an inactivation sub block predetermined. At step 2029-2, the base station 2006 may determine whether to apply polar code inactivation. That is, the base station 2006 may identify an index of an inactivation sub-block which is usable both by the first terminal 2002 and by the second terminal 2004, based on the index of the inactivation sub-block identified as being usable at the first terminal 2002 at step 2005-1, and the index of the inactivation sub-block usable at the second terminal 2004, and may determine this as an inactivation sub-block. In an embodiment, when the inactivation sub-block usable at the first terminal 2002 and the inactivation sub-block usable at the second terminal 2004 are different, the base station 2006 may determine that the polar code sub-block inactivation is not applicable to the first terminal 2002 and the second terminal 2004.

At step 2031, the base station 2006 may transmit an inactivation application response and inactivation sequence information to the first terminal 2002. That is, the base station 2006 may transmit information on the inactivation sub-block determined at step 2029-2 to the first terminal 2002. However, when the base station 2006 determines that polar code sub-block inactivation is not applicable, the base station 2006 may transmit corresponding information to the first terminal 2002.

At step 2033, the base station 2006 may transmit an inactivation application response and inactivation sequence information to the second terminal 2004. That is, the base station 2006 may transmit information regarding the inactivation sub-block determined at step 2029-2 to the second terminal 2004. However, when the base station 2006 determines that polar code sub-block inactivation is not applicable, the base station 2006 may transmit corresponding information to the second terminal 2004.

At step 2035, the first terminal 2002 and the second terminal 2004 may apply polar code inactivation. That is, the first terminal 2002 and the second terminal 2004 may apply sub-block inactivation when encoding and decoding, based on the information on the inactivation sub-block which is usable both at the first terminal 2002 and at the second terminal 2004, and which is received from the base station. In an embodiment, when the base station 2006 determines that polar code sub-block inactivation is not applicable, the first terminal 2002 and the second terminal 2004 may not apply polar code sub-block inactivation when encoding and decoding, although this operation is not illustrated in FIG. 20B.

As described above, polar code sub-block inactivation may be performed at the transmission end or the reception end under various scenarios. FIGS. 21A to 23B, which will be described hereinbelow, illustrate graphs comparing block error rate (BLER) performance when sub-block inactivation described in the disclosure is applied, and SC decoding, SC-list decoding, and CA-SCL decoding is performed.

Figure 21A:
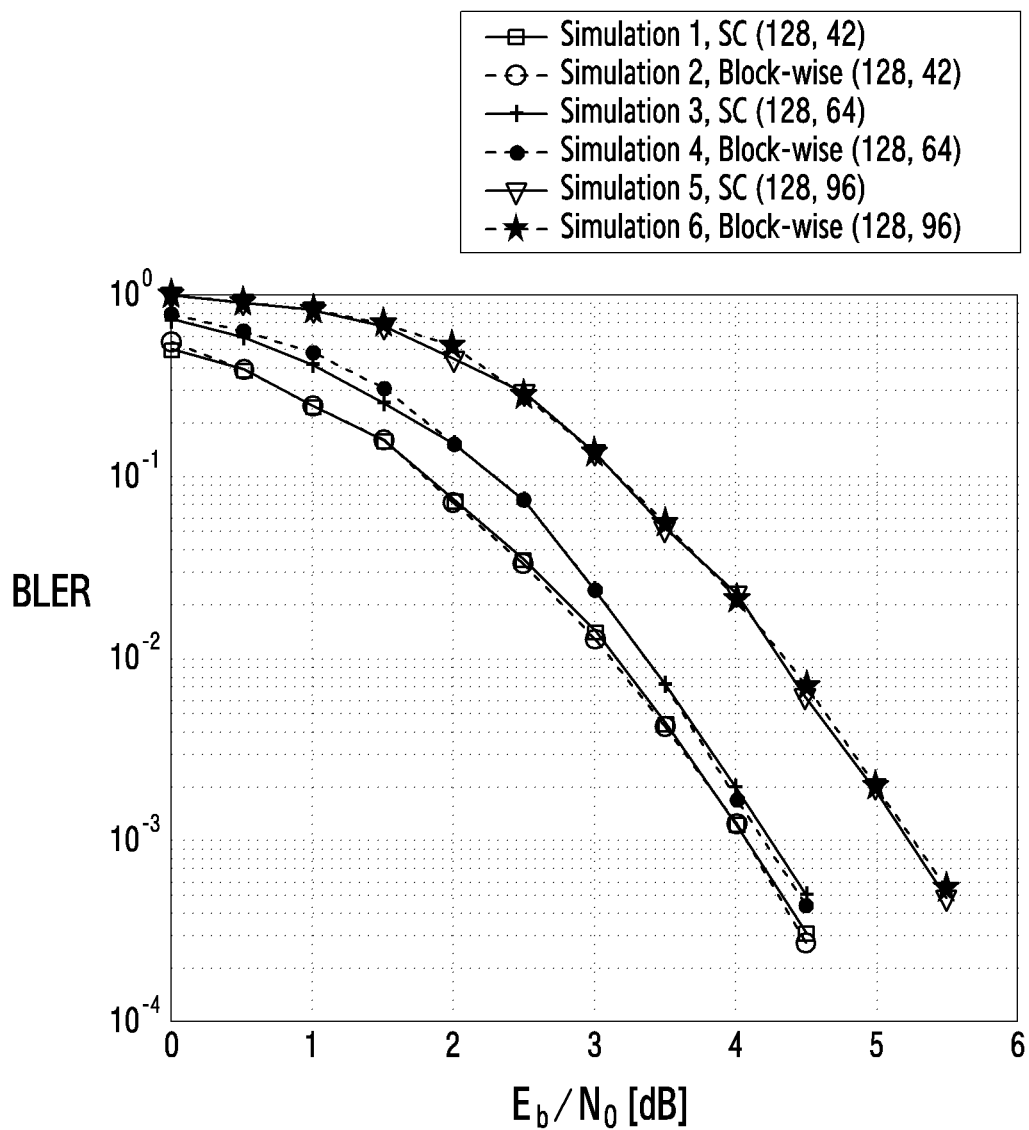
FIG. 21A is a view illustrating a graph showing block error rate (BLER) performance when SC decoding is performed in a wireless communication system according to various embodiments of the disclosure.

FIG. 21A illustrates a graph illustrating BLER performance when SC decoding is performed in a wireless communication system according to various embodiments of the disclosure. FIG. 21A is a graph comparing BLER performance according to Eb/N0 with respect to various code rates if a code length (N) is 128 and a size of a sub-block (Nsub) is 2.

Referring to FIG. 21A, performance of related-art SC decoding, indicated by solid lines, and performance of decoding according to the block-wise decoding algorithm of the disclosure, indicated by dashed lines, are similar to each other. For example, a BLER in a simulation 1 where the SC decoding technique is applied, and a BLER in a simulation 2 where the block-wise decoding technique of the disclosure is applied may be similar to each other. In addition, a BLER in a simulation 3 where the SC decoding technique is applied, and a BLER in a simulation 4 where the block-wise decoding technique of the disclosure is applied may be similar to each other. In addition, a BLER in a simulation 5 where the SC decoding technique is applied, and a BLER in a simulation 6 where the block-wise decoding technique of the disclosure is applied may be similar to each other. In various embodiments, comparison of operations of the related-art SC decoding technique and operations of the block-wise decoding technique of the disclosure according to code rates is shown in Table 6 presented below:

TABLE 6

| | | $N_{sub} = 2$ (Total number of sub-blocks: 64) | | | | |
| --- | --- | --- | --- | --- | --- | --- |
| Code Rate | Encoding technique | Number of blocks formed only of information bits | Number of blocks formed only of frozen bits | Inactivation rate | Number of operations | Reduction rate |
| R = ⅓ | SC decoding | — | — | — | 1066 | 13.70% |
| | Block-wise decoding | 17 | 39 | 87.5% | 920 | |
| R = ½ | SC decoding | — | — | — | 1088 | 14.89% |
| | Block-wise decoding | 27 | 27 | 84.4% | 926 | |
| R = ¾ | SC decoding | — | — | — | 1120 | 17.86% |
| | Block-wise decoding | 44 | 12 | 87.5% | 920 | |

Referring to Table 6, in the case of the normal SC decoding technique, the block-wise decoding technique of the disclosure, the reduction rate in the number of operations according to a ratio of an inactivation sub-block is explained under the same condition. In the case of the SC decoding, if bits in a sub-block are all information bits or frozen bits, performance degradation does not occur even when the sub-block is inactivated. It can be seen from Table 6 that the reduction rate in the number of operations is about 15%.

Figure 21B:
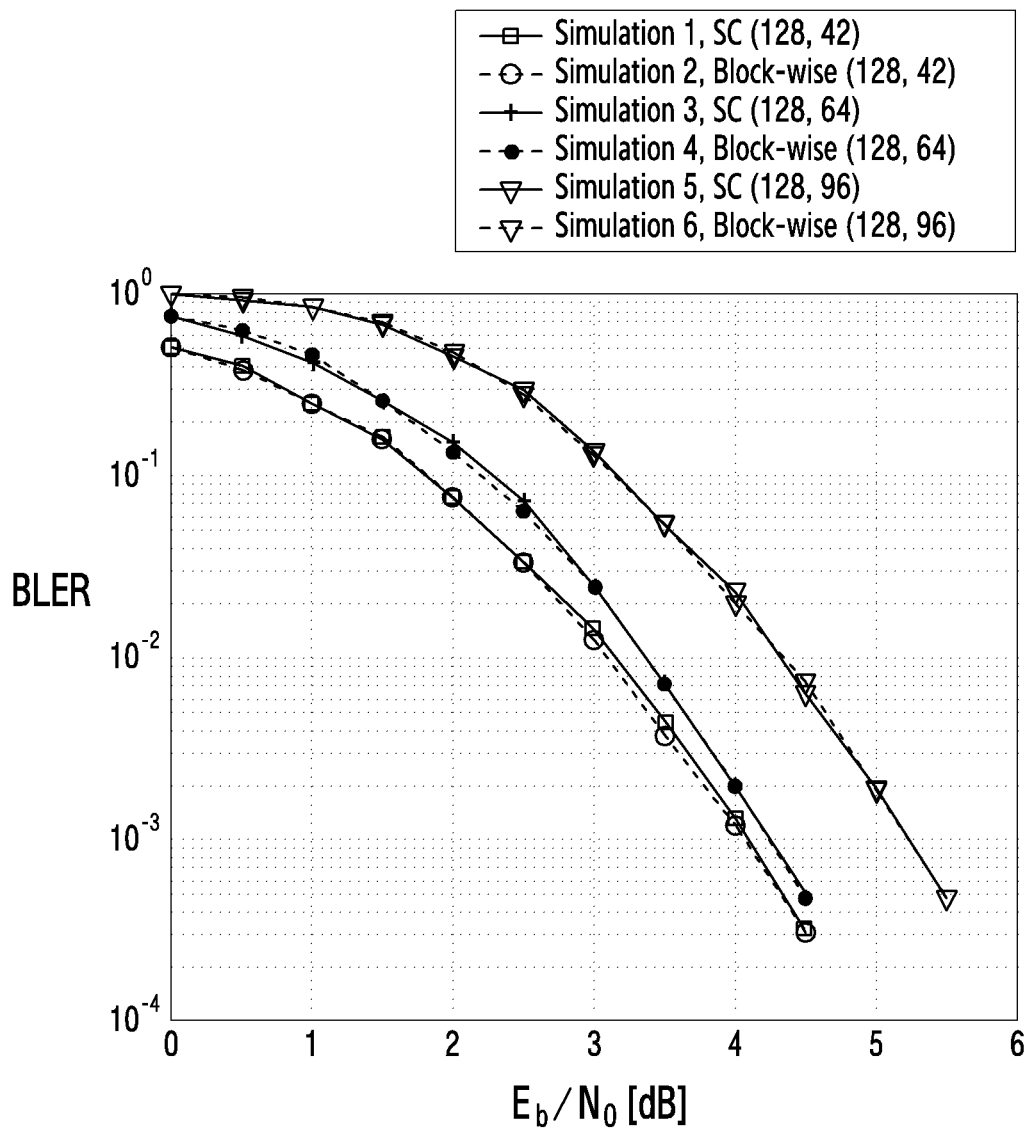
FIG. 21B is a view illustrating a graph showing BLER performance when SC decoding is performed in a wireless communication system according to various embodiments of the disclosure.

FIG. 21B illustrates a graph illustrating BLER performance when SC decoding is performed in a wireless communication system according to various embodiments of the disclosure. FIG. 21B is a graph comparing BLER performance according to $E_b/N_0$ with respect to various code rates if a code length (N) is 128 and a size of a sub-block ($N_{sub}$) is 4.

Referring to FIG. 21B, performance of related-art SC decoding, indicated by solid lines, and performance of decoding according to the block-wise decoding algorithm of the disclosure, indicated by dashed lines, are similar to each other. For example, a BLER in a simulation 1 where the SC decoding technique is applied, and a BLER in a simulation 2 where the block-wise decoding technique of the disclosure is applied may be similar to each other. In addition, a BLER in a simulation 3 where the SC decoding technique is applied, and a BLER in a simulation 4 where the block-wise decoding technique of the disclosure is applied may be similar to each other. In addition, a BLER in a simulation 5 where the SC decoding technique is applied, and a BLER in a simulation 6 where the block-wise decoding technique of the disclosure is applied may be similar to each other. In various embodiments, comparison of operations of the related-art SC decoding technique and operations of the block-wise decoding technique of the disclosure according to code rates is shown in Table 7 presented below:

TABLE 7

| | | $N_{sub}$ = 4 (Total number of sub-blocks: 32) | | | | |
|---|---|---|---|---|---|---|
| Code Rate | Encoding technique | Number of blocks formed only of information bits | Number of blocks formed only of frozen bits | Inactivation rate | Number of operations | Reduction rate |
| R = 1/3 | Related-art SC decoding | — | — | — | 1066 | 16.51% |
| | Block-wise decoding | 6 | 17 | 71.9% | 890 | |
| R = 1/2 | Related-art SC decoding | — | — | — | 1088 | 20.59% |
| | Block-wise decoding | 10 | 10 | 62.5% | 864 | |
| R = 3/4 | Related-art SC decoding | — | — | — | 1120 | 25.00% |
| | Block-wise decoding | 19 | 4 | 71.9% | 840 | |

Referring to Table 7, in the case of the related-art SC decoding technique, the block-wise decoding technique of the disclosure, the reduction rate in the number of operations according to a ratio of an inactivation sub-block is explained under the same condition. Comparing the case of Table 6 where the size of the sub-block is 2, table 7 shows that the number of operations is further reduced by about 3% to 7%, and almost similar decoding performance to that of the related-art SC decoding technique is exhibited.

Figure 21C:
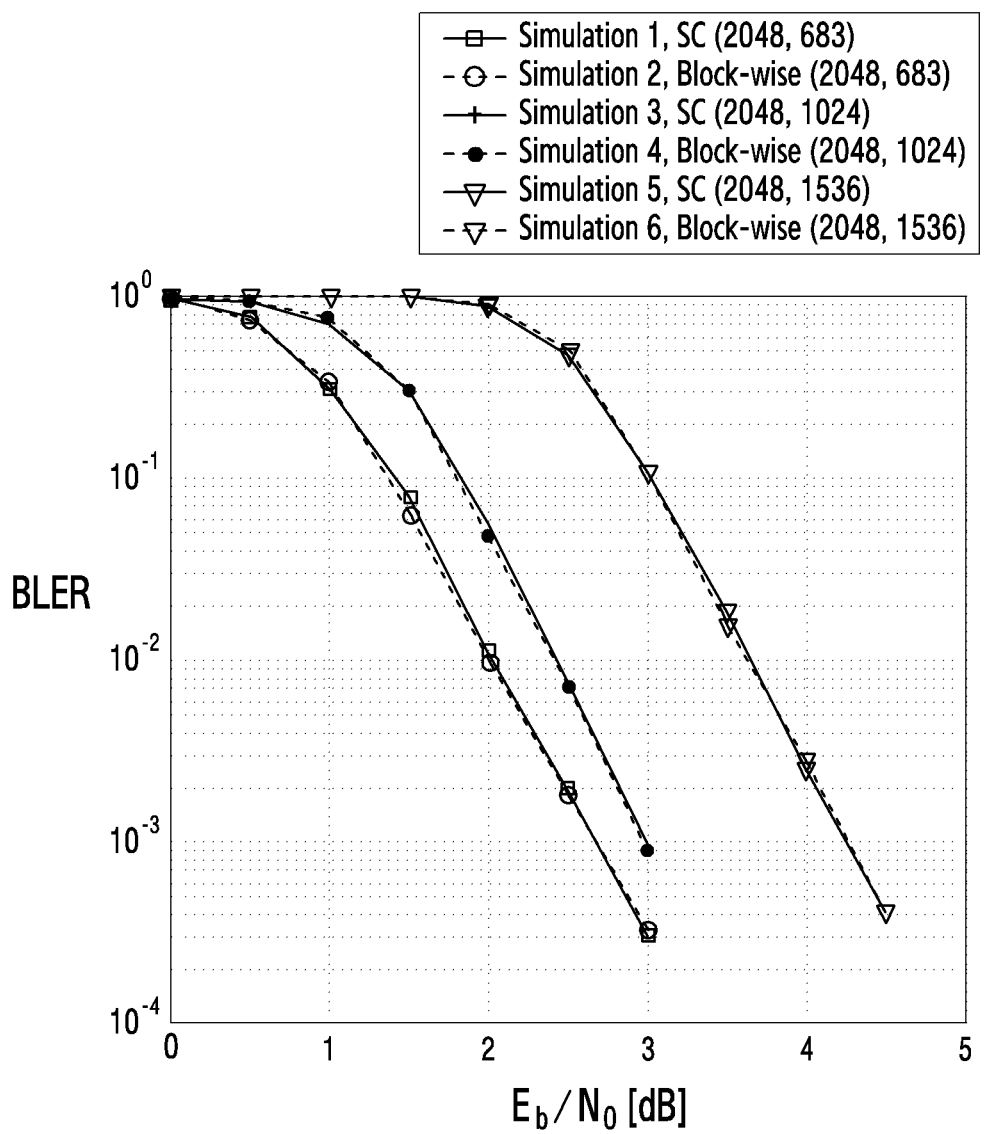
FIG. 21C is a view illustrating a graph showing BLER performance when SC decoding is performed in a wireless communication system according to various embodiments of the disclosure.

FIG. 21C illustrates a graph illustrating BLER performance when SC decoding is performed in a wireless communication system according to various embodiments of the disclosure. FIG. 21C is a graph comparing BLER performance according to $E_b/N_0$ with respect to various code rates when binary phase shift keying (BPSK) modulation is used if a code length (N) is 2048 and a size of a sub-block ($N_{sub}$) is 16.

Referring to FIG. 21C, performance of related-art SC decoding, indicated by solid lines, and performance of decoding according to the block-wise decoding algorithm of the disclosure, indicated by dashed lines, are similar to each other. For example, a BLER in a simulation 1 where the SC decoding technique is applied, and a BLER in a simulation 2 where the block-wise decoding technique of the disclosure is applied may be similar to each other. In addition, a BLER in a simulation 3 where the SC decoding technique is applied, and a BLER in a simulation 4 where the block-wise decoding technique of the disclosure is applied may be similar to each other. In addition, a BLER in a simulation 5 where the SC decoding technique is applied, and a BLER in a simulation 6 where the block-wise decoding technique of the disclosure is applied may be similar to each other. In various embodiments, comparison of operations of the related-art SC decoding technique and operations of the block-wise decoding technique of the disclosure according to code rates is shown in Table 8 presented below:

TABLE 8

| | | $N_{sub}$ = 16 (Total number of sub-blocks: 128) | | | | |
|---|---|---|---|---|---|---|
| Code Rate | Encoding technique | Number of blocks formed only of information bits | Number of blocks formed only of frozen bits | Inactivation rate | Number of operations | Reduction rate |
| R = 1/3 | Related-art SC decoding | — | — | — | 25259 | 22.1% |
| | Block-wise decoding | 21 | 61 | 64.1% | 19675 | |
| R = 1/2 | Related-art SC decoding | — | — | — | 25600 | 21.9% |
| | Block-wise decoding | 39 | 39 | 60.9% | 19984 | |
| R = 3/4 | Related-art SC decoding | — | — | — | 26112 | 26.3% |
| | Block-wise decoding | 74 | 15 | 69.5% | 19232 | |

Referring to Table 8, in the case of the related-art SC decoding technique, the block-wise decoding technique of the disclosure, the reduction rate in the number of operations according to a ratio of an inactivation sub-block is explained under the same condition. In various embodiments, even when all sub-blocks formed only of information bits or frozen bits are inactivated, performance degradation may not occur. In Table 8, the reduction rate in operations achieved through inactivation of sub-blocks increases as the code rate increases.

Figure 21D:
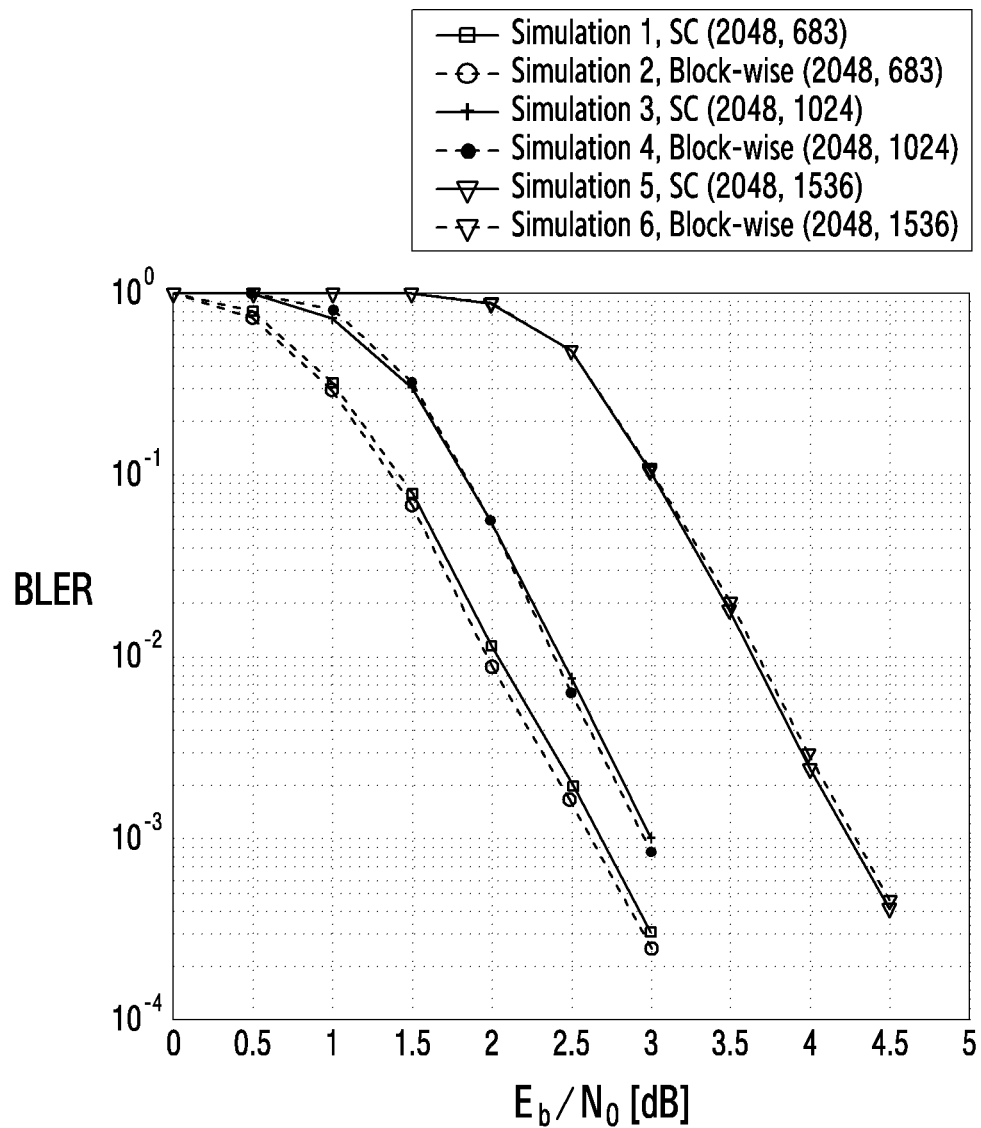
FIG. 21D is a view illustrating a graph showing BLER performance when SC decoding is performed in a wireless communication system according to various embodiments of the disclosure.

FIG. 21D illustrates a graph illustrating BLER performance when SC decoding is performed in a wireless communication system according to various embodiments of the disclosure. FIG. 21D is a graph comparing BLER performance according to $E_b/N_0$ with respect to various code rates when binary phase shift keying (BPSK) modulation is used if a code length (N) is 2048 and a size of a sub-block ($N_{sub}$) is 32.

Referring to FIG. 21D, performance of related-art SC decoding, indicated by solid lines, and performance of decoding according to the block-wise decoding algorithm of the disclosure, indicated by dashed lines, are similar to each other. For example, a BLER in a simulation 1 where the SC decoding technique is applied, and a BLER in a simulation 2 where the block-wise decoding technique of the disclosure is applied may be similar to each other. In addition, a BLER in a simulation 3 where the SC decoding technique is applied, and a BLER in a simulation 4 where the block-wise decoding technique of the disclosure is applied may be similar to each other. In addition, a BLER in a simulation 5 where the SC decoding technique is applied, and a BLER in a simulation 6 where the block-wise decoding technique of the disclosure is applied may be similar to each other. In various embodiments, comparison of operations of the related-art SC decoding technique and operations of the block-wise decoding technique of the disclosure according to code rates is shown in Table 9 presented below:

TABLE 9

$N_{sub}$ = 32 (Total number of sub-blocks: 64)

| Code Rate | Encoding technique | Number of blocks formed only of information bits | Number of blocks formed only of frozen bits | Inactivation rate | Number of operations | Reduction rate |
|---|---|---|---|---|---|---|
| R = 1/3 | Normal decoding | — | — | — | 25259 | 21.2% |
|  | Block-wise decoding | 7 | 25 | 50% | 19915 |  |
| R = 1/2 | Normal decoding | — | — | — | 25600 | 20.6% |
|  | Block-wise decoding | 15 | 15 | 46.9% | 20320 |  |
| R = 3/4 | Normal decoding | — | — | — | 26112 | 26.6% |
|  | Block-wise decoding | 32 | 5 | 57.8% | 19168 |  |

Referring to Table 9, in the case of the normal SC decoding technique, the block-wise decoding technique of the disclosure, the reduction rate in the number of operations according to a ratio of an inactivation sub-block is explained under the same condition. In various embodiments, even when all sub-blocks formed only of information bits or frozen bits are inactivated, performance degradation may not occur.

In various embodiments of the disclosure, when a CA-SCL decoding technique is used, a sub-block may be inactivated according to a different criterion from when the SC decoding technique is used. For example, a transmission end may inactivate sub-blocks formed only of frozen bits, first. When inactivating sub-blocks formed only of information bits, the transmission end may inactivate the sub-blocks in order from the sub-block of the highest degree, and, when the degrees of various sub-blocks are the same, the transmission end may inactivate sub-blocks in order from the sub-block having the highest index. In addition, when a sub-block including information bits and frozen bits all together is included in a block having a size two times larger than a size of a current sub-block, the transmission end may not inactivate the current sub-block. BLER performance of CA-SCL decoding when the above-described inactivation sub-block determination criterion is applied will be described in FIGS. 22A to 22B.

Figure 22A:
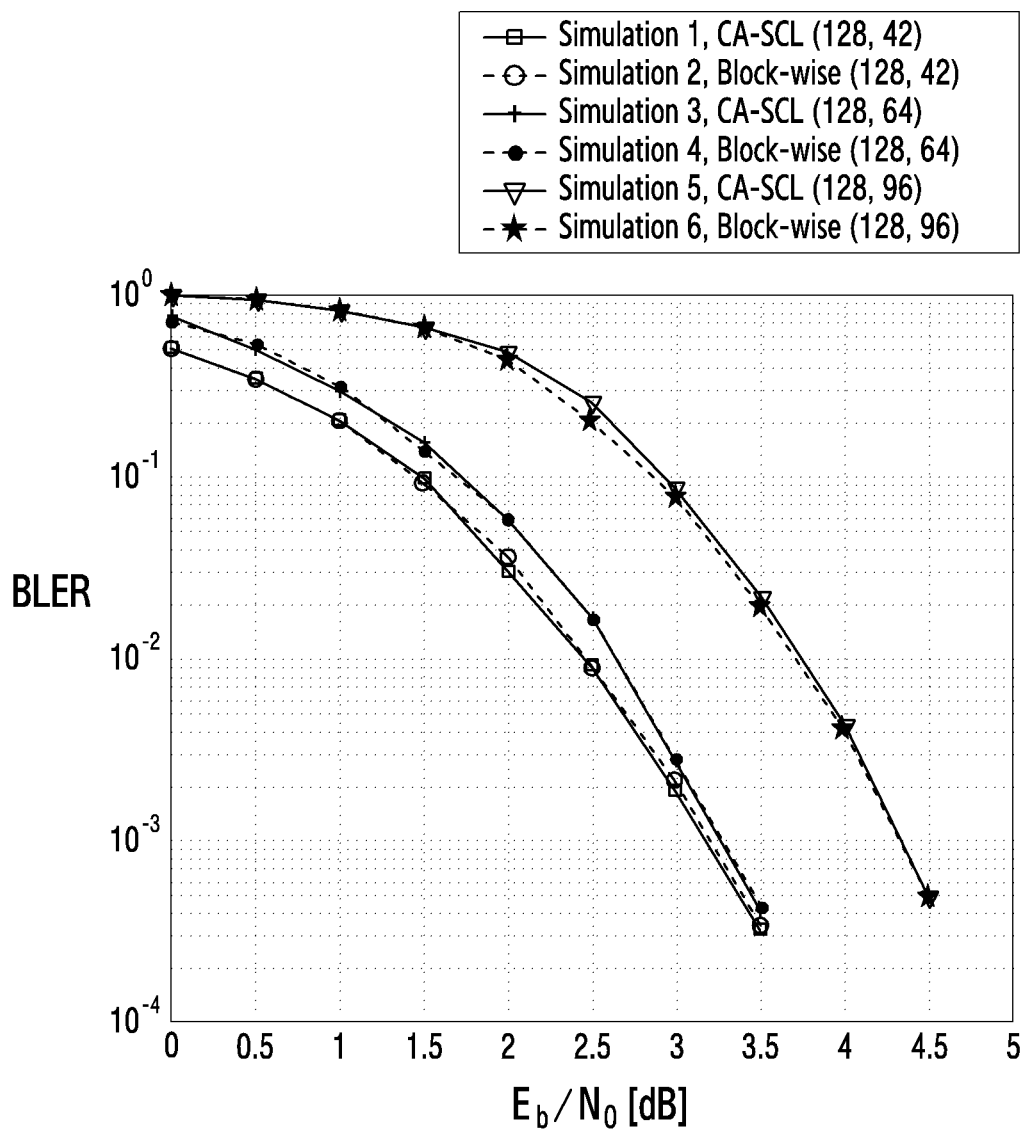
FIG. 22A is a view illustrating a graph showing BLER performance when CA-SCL decoding is performed in a wireless communication system according to various embodiments of the disclosure.

FIG. 22A illustrates a graph illustrating BLER performance when CA-SCL decoding is performed in a wireless communication system according to various embodiments of the disclosure. FIG. 22A is a graph comparing BLER performance according to $E_b/N_0$ with respect to various code rates if a code length (N) is 128, a size of a sub-block ($N_{sub}$) is 2, a size of a list is 8, and CRC is 8 bits.

Referring to FIG. 22A, performance of related-art CA-SCL decoding, indicated by solid lines, and performance of decoding according to the block-wise decoding algorithm of the disclosure, indicated by dashed lines, are similar to each other. For example, a BLER in a simulation 1 where the CA-SCL decoding technique is applied, and a BLER in a simulation 2 where the block-wise decoding technique of the disclosure is applied may be similar to each other. In addition, a BLER in a simulation 3 where the CA-SCL decoding technique is applied, and a BLER in a simulation 4 where the block-wise decoding technique of the disclosure is applied may be similar to each other. In addition, a BLER in a simulation 5 where the CA-SCL decoding technique is applied, and a BLER in a simulation 6 where the block-wise decoding technique of the disclosure is applied may be similar to each other. In various embodiments, comparison of operations of the related-art CA-SCL decoding technique and operations of the block-wise decoding technique of the disclosure according to code rates is shown in Table 10 presented below:

TABLE 10

$N_{sub}$ = 2 (Total number of sub-blocks: 64), List = 8

| Code Rate | Encoding technique | Number of blocks formed only of information bits | Number of blocks formed only of frozen bits | Inactivation rate | Number of operations | Reduction rate |
|---|---|---|---|---|---|---|
| R = 1/3 | Normal decoding | — | — | — | 8975 | 24.09% |
|  | Block-wise decoding | 11 | 34 | 70.3% | 6813 |  |
| R = 1/2 | Normal decoding | — | — | — | 11763 | 25.52% |
|  | Block-wise decoding | 16 | 23 | 76.6% | 8761 |  |
| R = 3/4 | Normal decoding | — | — | — | 14969 | 35.67% |
|  | Block-wise decoding | 30 | 9 | 60.9% | 9629 |  |

Referring to Table 10, in the case of the normal decoding technique, the block-wise decoding technique of the disclosure, the reduction rate in the number of operations according to a ratio of an inactivation sub-block is explained under the same condition. That is, when CA-SCL decoding is performed and the sub-block-wise decoding technique of the disclosure is used, the reduction rate in the number of operations may increase to 24.09%, 25.52%, 35.67% as the code rate increases to 1/3, 1/2, 3/4.

Figure 22B:
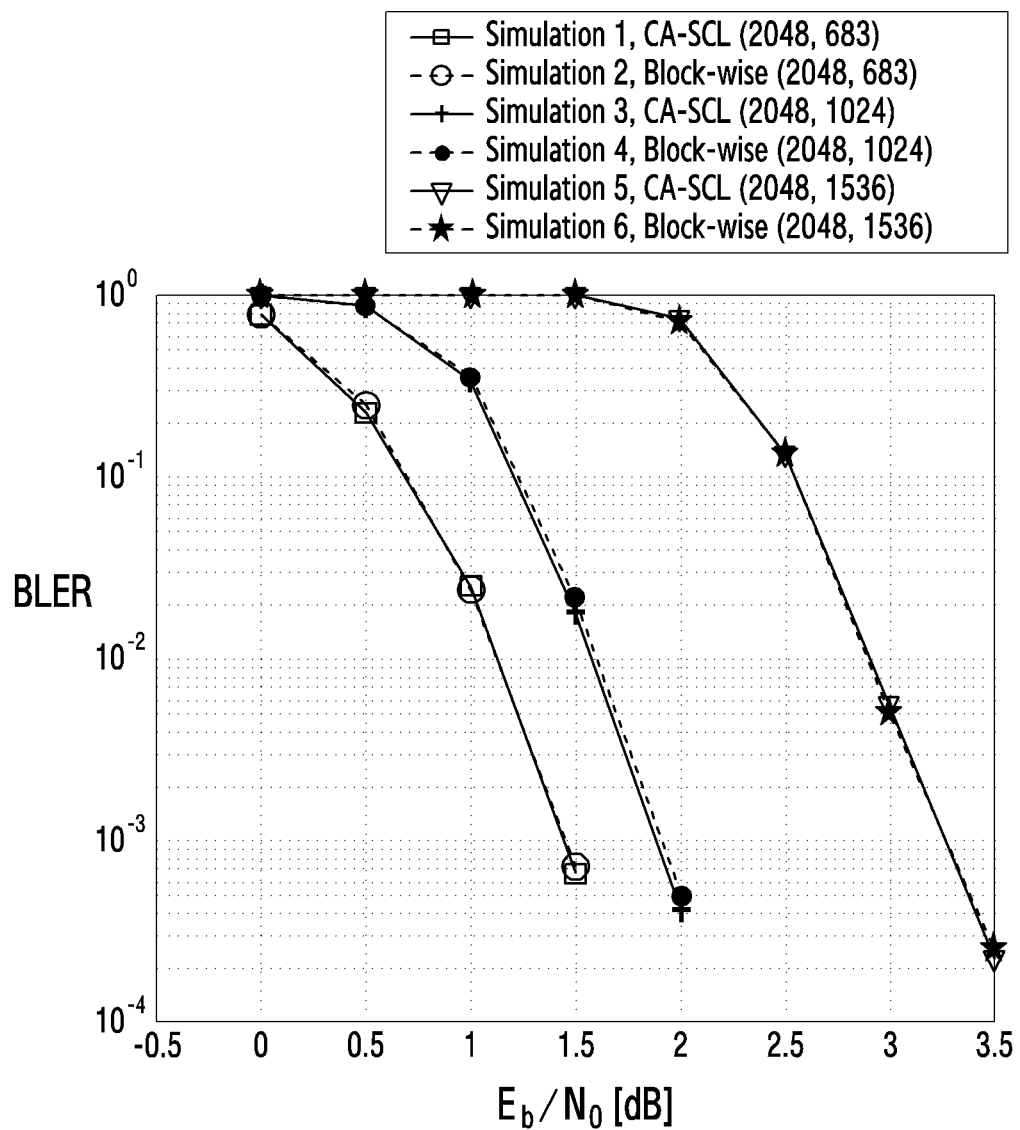
FIG. 22B is a view illustrating a graph showing BLER performance when CA-SCL decoding is performed in a wireless communication system according to various embodiments of the disclosure.

FIG. 22B illustrates a graph illustrating BLER performance when CA-SCL decoding is performed in a wireless communication system according to various embodiments of the disclosure. FIG. 22B is a graph comparing BLER performance according to $E_b/N_0$ with respect to various code rates if a code length (N) is 2048, a size of a sub-block ($N_{sub}$) is 16, a size of a list is 8, and CRC is 16 bits.

Referring to FIG. 22B, performance of related-art CA-SCL decoding, indicated by solid lines, and performance of decoding according to the block-wise decoding algorithm of the disclosure, indicated by dashed lines, are similar to each other. For example, a BLER in a simulation 1 where the CA-SCL decoding technique is applied, and a BLER in a simulation 2 where the block-wise decoding technique of the disclosure is applied may be similar to each other. In addition, a BLER in a simulation 3 where the CA-SCL decoding technique is applied, and a BLER in a simulation 4 where the block-wise decoding technique of the disclosure is applied may be similar to each other. In addition, a BLER in a simulation 5 where the CA-SCL decoding technique is applied, and a BLER in a simulation 6 where the block-wise decoding technique of the disclosure is applied may be similar to each other. In various embodiments, comparison of operations of the related-art CA-SCL decoding technique and operations of the block-wise decoding technique of the disclosure according to code rates is shown in Table 11 presented below:

TABLE 11

$N_{sub} = 16$ (Total number of sub-blocks: 32), List = 8

| Code Rate | Encoding technique | Number of blocks formed only of information bits | Number of blocks formed only of frozen bits | Inactivation rate | Number of operations | Reduction rate |
|---|---|---|---|---|---|---|
| R = ⅓ | Normal decoding | — | — | — | 206306 | 18.27% |
| | Block-wise decoding | 12 | 57 | 53.9% | 168607 | |
| R = ½ | Normal decoding | — | — | — | 242535 | 21.24% |
| | Block-wise decoding | 24 | 35 | 46.1% | 191015 | |
| R = ¾ | Normal decoding | — | — | — | 297457 | 31.99% |
| | Block-wise decoding | 52 | 11 | 49.2% | 202289 | |

Referring to Table 11, in the case of the normal decoding technique, the block-wise decoding technique of the disclosure, the reduction rate in the number of operations according to a ratio of an inactivation sub-block is explained under the same condition. That is, when CA-SCL decoding is performed and the sub-block-wise decoding technique of the disclosure is used, the reduction rate in the number of operations may increase to 18.27%, 21.24%, 31.99% as the code rate increases to ⅓, ½, ¾.

Figure 23A:
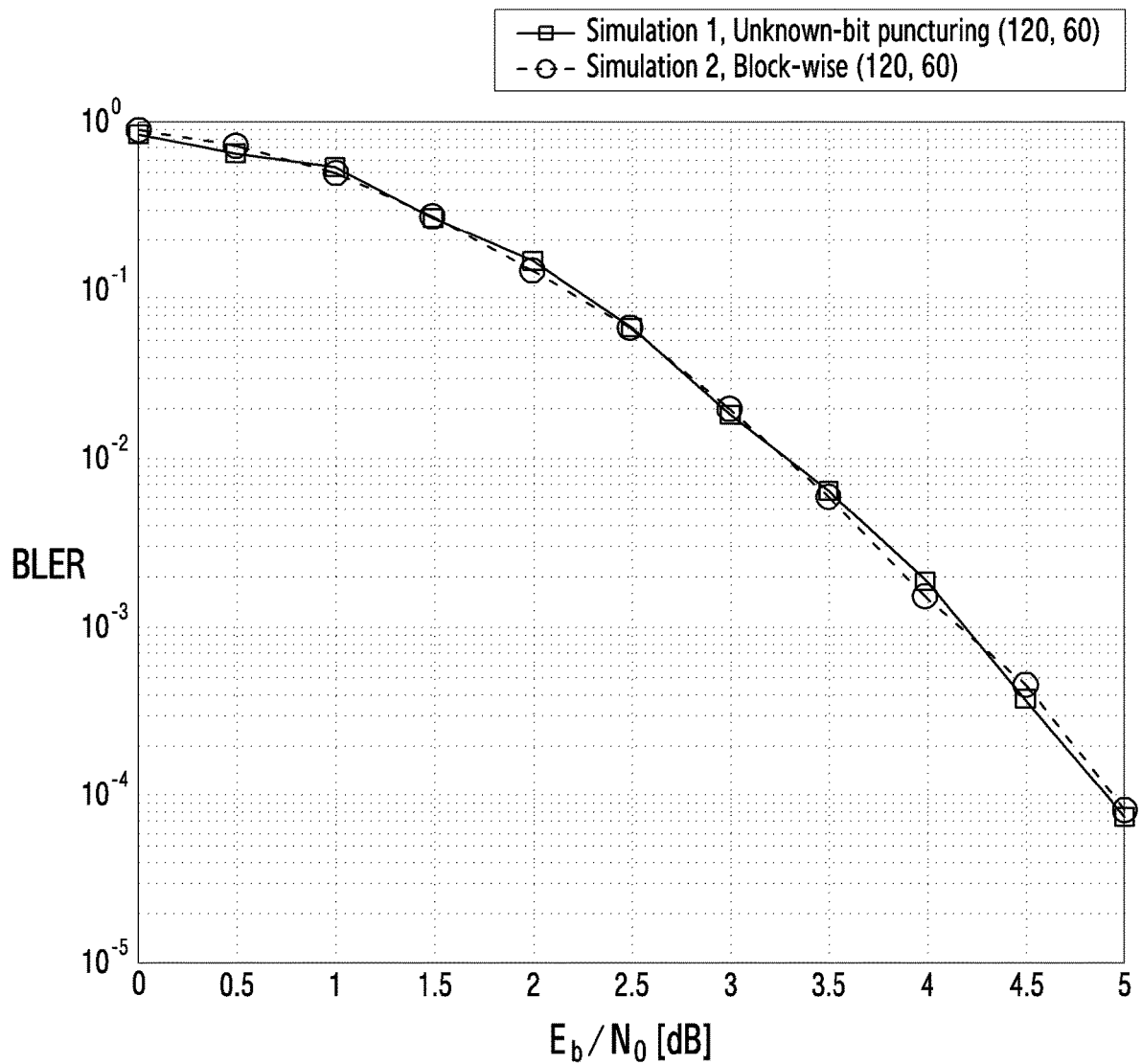
FIG. 23A is a view illustrating a graph showing BLER performance when CA-SCL decoding to which a puncturing technique is applied is performed in a wireless communication system according to various embodiments of the disclosure.

FIG. 23A illustrates a graph illustrating BLER performance when CA-SCL decoding to which capacity-0 puncturing is applied is performed in a wireless communication system according to various embodiments of the disclosure. FIG. 23A is a graph comparing BLER performance according to $E_b/N_0$ if a code length (N) is 128, a size of a sub-block ($N_{sub}$) is 2, a size of a list is 4, and CRC is 8 bits.

Referring to FIG. 23A, performance of decoding of related-art unknown bit puncturing, indicated by solid lines, and performance of decoding according to the block-wise decoding algorithm of the disclosure, indicated by dashed lines, are similar to each other. For example, a BLER in a simulation 1 where the unknown bit puncturing decoding technique is applied, and a BLER in a simulation 2 where the block-wise decoding technique of the disclosure is applied may be similar to each other. In various embodiments, in the case of the unknown bit puncturing, a node operation may not be performed within a sub-block through the same sub-block inactivation determining method as in the above-described CA-SCL decoding. As a result, the performance of decoding of the related-art unknown bit puncturing, and the performance of decoding according to the block-wise decoding algorithm of the disclosure, indicated by dashed lines, may be similar to each other. In various embodiments, comparison of operations of the related-art unknown bit puncturing decoding technique and operations of the block-wise decoding technique of the disclosure according to code rates is shown in Table 12 presented below:

TABLE 12

$N_{sub} = 2$ (Total number of sub-blocks: 64), List = 4

| Code Rate | Encoding technique | Number of blocks formed only of information bits | Number of blocks formed only of frozen bits | Inactivation rate | Number of operations | Reduction rate |
|---|---|---|---|---|---|---|
| R = ½ | Normal decoding | — | — | — | 4851 | 18.97% |
| | Block-wise decoding | 14 | 23 | 57.8% | 3931 | |

Referring to Table 12, in the case of the normal decoding technique, the block-wise decoding technique of the disclosure, the reduction rate in the number of operations according to a ratio of an inactivation sub-block is explained under the same condition. That is, when CA-SCL decoding to which unknown bit puncturing is applied is performed, and the sub-block-wise decoding technique of the disclosure is used, the reduction rate in the number of operations is 18.97% at the code rate of ½, and operation complexity may be lower than in the normal decoding technique.

Figure 23B:
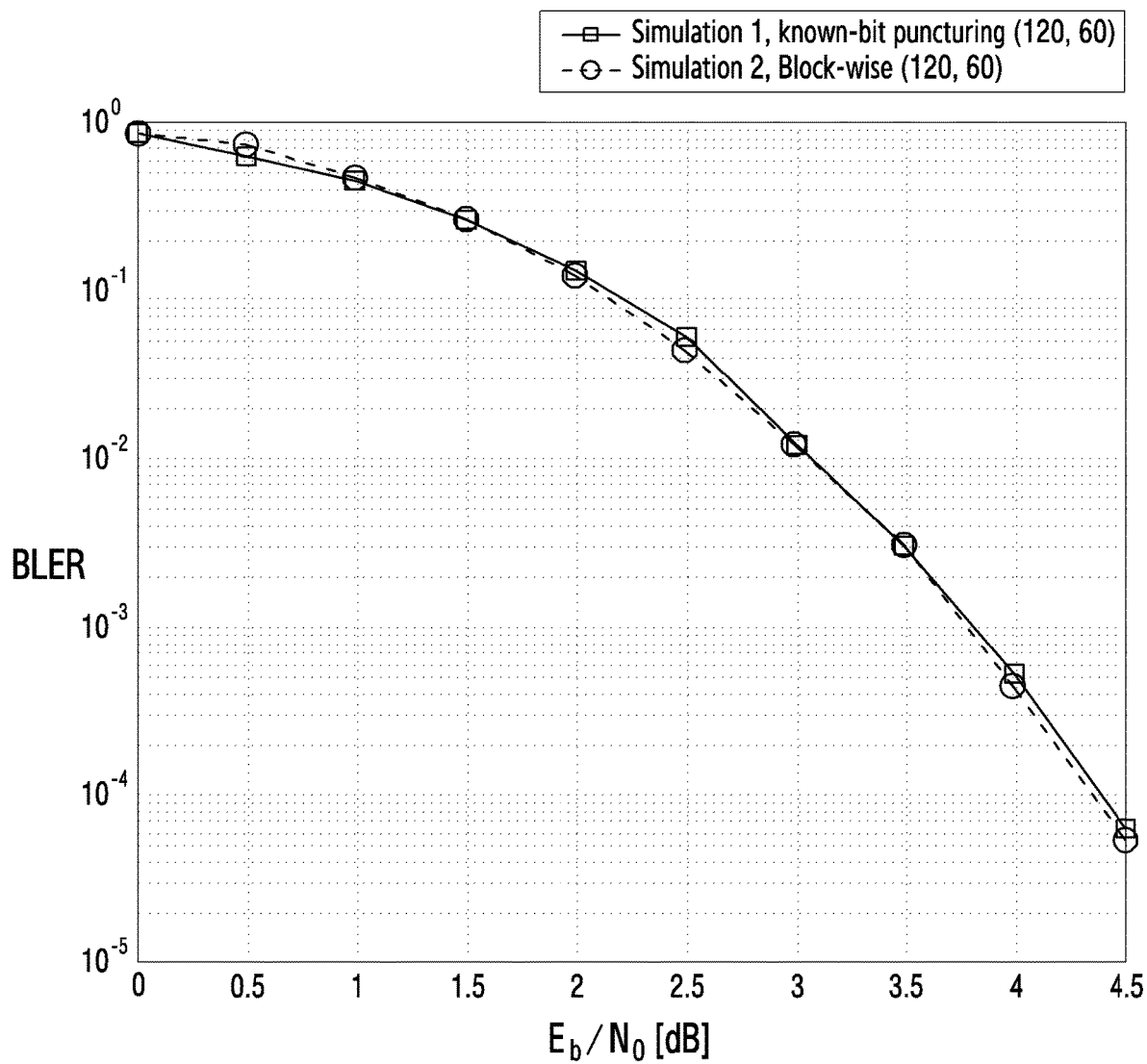
FIG. 23B is a view illustrating a graph showing BLER performance when CA-SCL decoding to which a puncturing technique is applied is performed in a wireless communication system according to various embodiments of the disclosure.

FIG. 23B illustrates a graph illustrating BLER performance when CA-SCL decoding to which puncturing is applied is performed in a wireless communication system according to various embodiments of the disclosure. FIG. 23B is a graph comparing BLER performance according to $E_b/N_0$ if a code length (N) is 128, a size of a sub-block ($N_{sub}$) is 2, a size of a list is 4, and CRC is 8 bits.

Referring to FIG. 23B, performance of decoding by applying a related-art shortening technique, indicated by solid lines, and performance of decoding according to the block-wise decoding algorithm of the disclosure, indicated by dashed lines, are similar to each other. For example, a BLER in a simulation 1 where the related-art shortening technique is applied, and a BLER in a simulation 2 where the block-wise decoding technique of the disclosure is applied may be similar to each other. In various embodiments, in the case of the shortening technique, a node operation may not be performed within a sub-block through the same sub-block inactivation determining method as in the above-described CA-SCL decoding. As a result, the performance of decoding by the related-art shortening technique, and the performance of decoding according to the block-wise decoding algorithm of the disclosure, indicated by dashed lines, may be similar to each other. In various embodiments, comparison of operations of the decoding technique when related-art shortening is applied, and operations of the block-wise decoding technique of the disclosure according to code rates is shown in Table 13 presented below:

TABLE 13

$N_{sub} = 2$ (Total number of sub-blocks: 64), List = 4

| Code Rate | Encoding technique | Number of blocks formed only of information bits | Number of blocks formed only of frozen bits | Inactivation rate | Number of operations | Reduction rate |
|---|---|---|---|---|---|---|
| R = ½ | Normal decoding | — | — | — | 4833 | 23.26% |
| | Block-wise decoding | 18 | 25 | 67.2% | 3709 | |

Referring to Table 13, in the case of the normal decoding technique, the block-wise decoding technique of the disclosure, the reduction rate in the number of operations according to a ratio of an inactivation sub-block is explained under the same condition. That is, when CA-SCL decoding to which shortening is applied is performed, and the sub-block-wise decoding technique of the disclosure is used, the reduction rate in the number of operations is 23.26% at the code rate of ½, and operation complexity may be lower than in the normal decoding technique.

As described above, when the sub-block inactivation method according to various embodiments of the disclosure is applied, operation complexity can be reduced in various decoding techniques including SC decoding, CA-SCL decoding, and CA-SCL decoding to which puncturing or shortening is applied.

Methods based on the claims or the embodiments disclosed in the disclosure may be implemented in hardware, software, or a combination of both.

When implemented in software, a computer readable storage medium for storing one or more programs (software modules) may be provided. The one or more programs stored in the computer readable storage medium are configured for execution performed by one or more processors in an electronic device. The one or more programs include instructions for allowing the electronic device to execute the methods based on the claims or the embodiments disclosed in the disclosure.

The program (the software module or software) may be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network such as the Internet, an Intranet, a local area network (LAN), a wide LAN (WLAN), or a storage area network (SAN) or a communication network configured by combining the networks. The storage device may access via an external port to a device which performs the embodiments of the disclosure. In addition, an additional storage device on a communication network may access to a device which performs the embodiments of the disclosure.

In the above-described specific embodiments of the disclosure, elements included in the disclosure are expressed in singular or plural forms according to specific embodiments. However, singular or plural forms are appropriately selected according to suggested situations for convenience of explanation, and the disclosure is not limited to a single element or plural elements. An element which is expressed in a plural form may be configured in a singular form or an element which is expressed in a singular form may be configured in plural number.

While the disclosure has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

The invention claimed is:

1. A method performed by a first device in a wireless communication system, the method comprising:
    from among sub-blocks comprising at least one node, identifying, by at least one processor of the first device, at least one inactivation sub-block for inactivating a node operation in the sub-blocks;
    encoding data by using a generator matrix which is determined based on the at least one inactivation sub-block; and
    transmitting the encoded data to a second device.

2. The method of claim 1, wherein identifying the at least one inactivation sub-block comprises:
    identifying a decoding method of the second device;
    identifying at least one of an information bit, a frozen bit or a CRC bit, a puncturing bit included in the sub-blocks, based on the identified decoding method; and
    determining the at least one inactivation sub-block according to a result of the identifying.

3. The method of claim 2, wherein determining the at least one inactivation sub-block comprises:
    determining a sub-block including only the frozen bit from among the sub-blocks as an inactivation sub-block; and
    determining a sub-block including only the information bit from among the sub-blocks as an inactivation sub-block.

4. The method of claim 2, wherein determining the at least one inactivation sub-block comprises:
    determining a sub-block including only the frozen bit from among the sub-blocks as an inactivation sub-block; and
    determining an inactivation sub-block based on a degree and an index of a sub-block including only the information bit from among the sub-blocks.

5. The method of claim 2, wherein determining the at least one inactivation sub-block comprises:
    determining a sub-block including only the frozen bit from among the sub-blocks as an inactivation sub-block;
    determining an inactivation sub-block based on a degree and an index of a sub-block including only the information bit from among the sub-blocks; and determining a sub-block including only the puncturing bit from among the sub-blocks, and a sub-block including the frozen bit and the puncturing bit as inactivation sub-blocks.

6. The method of claim 1, further comprising:
determining a set including an index of the at least one inactivation sub-block, based on a code length of a polar code and a size of a sub-block; and
generating the generator matrix, based on a position of an index of the at least one inactivation sub-block included in the set.

7. A method performed by a second device in a wireless communication system, the method comprising:
receiving encoded data from a first device;
from among sub-blocks comprising at least one node, identifying, by at least one processor of the second device, at least one inactivation sub-block for inactivating a node operation within the sub-blocks; and
decoding the encoded data, based on the at least one inactivation sub-block,
wherein the encoded data is encoded by using a generator matrix which is determined based on the at least one inactivation sub-block.

8. The method of claim 7, wherein identifying the at least one inactivation sub-block comprises identifying, from a set including an index of the at least one inactivation sub-block, a value of an element included in the set, thereby identifying the index of the at least one inactivation sub-block.

9. The method of claim 8, wherein the index of the at least one inactivation sub-block is determined based on a length of a polar code and a size of a sub-block, and
wherein the generator matrix is determined based on an index position of the at least one inactivation sub-block included in the set.

10. The method of claim 7, wherein the at least one inactivation sub-block comprises a sub-block which includes only a frozen bit from among the sub-blocks, and a sub-block which includes only an information bit from among the sub-blocks.

11. The method of claim 7, wherein the at least one inactivation sub-block comprises a sub-block including only a frozen bit from among the sub-blocks, and is determined based on a degree and an index of a sub-block including only an information bit from among the sub-blocks.

12. The method of claim 7, wherein the at least one inactivation sub-block is determined by a sub-block including only a frozen bit from among the sub-blocks, is determined based on a degree and an index of a sub-block including only an information bit from among the sub-blocks, and is determined by a sub-block including only a puncturing bit from among the sub-blocks, and a sub-block including the frozen bit and the puncturing bit.

13. A first device in a wireless communication system, the first device comprising:
at least one processor configured to, from among sub-blocks comprising at least one node, identify at least one inactivation sub-block for inactivating a node operation in the sub-blocks, and to encode data by using a generator matrix which is determined based on the at least one inactivation sub-block; and
a transmission and reception unit configured to transmit the encoded data to a second device.

14. The first device of claim 13, wherein the at least one processor is configured to:
identify a decoding method of the second device;
identify at least one of an information bit, a frozen bit or a CRC bit, a puncturing bit included in the sub-blocks, based on the identified decoding method; and
determine the at least one inactivation sub-block according to a result of the identifying.

* * * * *